United States Patent
Zeng et al.

(10) Patent No.: US 11,024,588 B2
(45) Date of Patent: Jun. 1, 2021

(54) POWER INTEGRATED MODULE

(71) Applicant: Delta Electronics (Shanghai) CO., LTD, Shanghai (CN)

(72) Inventors: Jianhong Zeng, Shanghai (CN); Yan Chen, Shanghai (CN); Le Liang, Shanghai (CN); Xiaoni Xin, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 16/820,690

(22) Filed: Mar. 16, 2020

(65) Prior Publication Data
US 2020/0303326 A1 Sep. 24, 2020

Related U.S. Application Data

(63) Continuation of application No. 15/410,858, filed on Jan. 20, 2017, now Pat. No. 10,629,550, which is a
(Continued)

(30) Foreign Application Priority Data

Oct. 31, 2012 (CN) .......................... 201210429620.8
Aug. 26, 2016 (CN) .......................... 201610744334.9

(51) Int. Cl.
*H01L 23/538* (2006.01)
*H01L 23/64* (2006.01)
(Continued)

(52) U.S. Cl.
CPC .......... *H01L 23/642* (2013.01); *H01L 23/481* (2013.01); *H01L 23/4824* (2013.01);
(Continued)

(58) Field of Classification Search
CPC ..... H01L 23/642; H01L 27/088; H01L 24/82; H01L 24/24; H01L 27/0203; H01L 23/5222; H01L 23/5389; H01L 23/528; H01L 23/50; H01L 23/66; H01L 23/4824; H01L 24/08; H01L 23/481; H01L 24/04; H01L 24/05; H01L 2224/24137;
(Continued)

(56) References Cited

U.S. PATENT DOCUMENTS 8,258,549 B2 * 9/2012 Becker ............ H01L 21/823871
257/206
8,669,594 B2 * 3/2014 Becker .................. H01L 27/092
257/206

* cited by examiner

*Primary Examiner* — Selim U Ahmed
(74) *Attorney, Agent, or Firm* — Qinghong Xu

(57) ABSTRACT

A power integrated module, including at least one first bridge formed in a chip, wherein the first bridge includes: a first upper bridge switch, formed by a plurality of first sub switches formed in the chip connected in parallel, and including a first, a second and a control end; a first lower bridge switch, formed by a plurality of second sub switches formed in the chip connected in parallel, and including a first, a second and a control end; a first electrode, connected to the first end of the first upper bridge switch; a second electrode, connected to the second end of the first lower bridge switch; and a third electrode, connected to the second end of the first upper bridge switch and the first end of the first lower bridge switch, wherein the first, the second and the third electrode are bar-type electrodes arranged side by side.

15 Claims, 40 Drawing Sheets

Related U.S. Application Data continuation of application No. 14/798,484, filed on Jul. 14, 2015, now Pat. No. 9,754,871, which is a continuation of application No. 13/760,079, filed on Feb. 6, 2013, now Pat. No. 9,111,928.

(51) Int. Cl.
| | |
|---|---|
| *H01L 23/50* | (2006.01) |
| *H01L 23/66* | (2006.01) |
| *H01L 23/482* | (2006.01) |
| *H01L 23/00* | (2006.01) |
| *H01L 23/48* | (2006.01) |
| *H01L 27/088* | (2006.01) |
| *H01L 27/02* | (2006.01) |
| *H01L 23/522* | (2006.01) |
| *H01L 23/528* | (2006.01) |
| *H01L 21/56* | (2006.01) |

(52) U.S. Cl.
CPC ............ *H01L 23/50* (2013.01); *H01L 23/528* (2013.01); *H01L 23/5222* (2013.01); *H01L 23/5389* (2013.01); *H01L 23/66* (2013.01); *H01L 24/04* (2013.01); *H01L 24/05* (2013.01); *H01L 24/08* (2013.01); *H01L 24/24* (2013.01); *H01L 24/82* (2013.01); *H01L 27/0203* (2013.01); *H01L 27/088* (2013.01); *H01L 21/568* (2013.01); *H01L 24/73* (2013.01); *H01L 2223/6655* (2013.01); *H01L 2223/6661* (2013.01); *H01L 2224/04105* (2013.01); *H01L 2224/0557* (2013.01); *H01L 2224/08195* (2013.01); *H01L 2224/08225* (2013.01); *H01L 2224/08265* (2013.01); *H01L 2224/24137* (2013.01); *H01L 2224/24245* (2013.01); *H01L 2224/32145* (2013.01); *H01L 2224/32245* (2013.01); *H01L 2224/33181* (2013.01); *H01L 2224/48091* (2013.01); *H01L 2224/48137* (2013.01); *H01L 2224/48247* (2013.01); *H01L 2224/73265* (2013.01); *H01L 2224/82039* (2013.01); *H01L 2924/1301* (2013.01); *H01L 2924/1305* (2013.01); *H01L 2924/13055* (2013.01); *H01L 2924/13062* (2013.01); *H01L 2924/13091* (2013.01); *H01L 2924/19041* (2013.01); *H01L 2924/19042* (2013.01); *H01L 2924/19104* (2013.01); *H01L 2924/19105* (2013.01); *H01L 2924/3011* (2013.01); *H01L 2924/30107* (2013.01)

(58) Field of Classification Search
CPC . H01L 2224/48137; H01L 2224/48091; H01L 2224/82039; H01L 2924/1305; H01L 2924/19042; H01L 2924/30107; H01L 2924/13062; H01L 2224/32245; H01L 2924/3011; H01L 24/73; H01L 2924/13091; H01L 2224/33181; H01L 2924/1301; H01L 21/568; H01L 2224/24245; H01L 2924/13055; H01L 2224/32145; H01L 2224/48247; H01L 2224/73265; H01L 2924/19104; H01L 2924/19105; H01L 2924/19041; H01L 2223/6661; H01L 2223/6655; H01L 2224/08195; H01L 2224/08265; H01L 2224/08225; H01L 2224/04105; H01L 2224/0557

See application file for complete search history.

POWER INTEGRATED MODULE

CROSS REFERENCE

This application is a CA of CIP of U.S. application Ser. No. 14/798,484 filed on Jul. 14, 2015, based upon and claims priority to it, Chinese Patent Application No. 201610744334.9 filed on Aug. 26, 2016. Chinese Patent Application No. 201210429620.8 filed on Oct. 31, 2012, and U.S. application Ser. No. 13/760,079 filed on Feb. 6, 2013, the entire contents of which are incorporated herein by reference.

TECHNICAL FIELD

The present disclosure relates to the field of power electronic technology, and more particularly, to a power integrated module.

BACKGROUND

High power density is always required for power converters in the field, because high power density means a small volume, a light weight, a reduced space occupation and a reduced cost. Along with a pursuit of high power density of switching power supplies, high operating frequencies are adopted more and more widely. High operating frequencies can effectively increase power density of switching power supplies, which is a forever pursuit in switching power supply technology.

Since insulating treatments may be performed among respective cells, on one and the same silicon chip, of a planar type device, the respective cells may be combined as needed so as to achieve high integration. Since distribution parameters of a planar type device may be decreased, planar type devices represent a typical development direction of high frequency devices. In order to achieve high performance of planar type devices, one way is to conduct various optimizations on integration processes.

All bridge circuits in a power integrated module can be integrated in a semiconductor chip, and the power integrated module may be applied in various power conversion circuits such as a Boost conversion circuit, a Buck conversion circuit, a full bridge circuit or a half bridge circuit. If the semiconductor chip integrating the bridge circuits is optimized to be more applicable to high frequency applications, performance of the above various conversion circuits may be further improved.

It should be noted that, the above information disclosed in this Background section is only for helping understanding of the background of the present disclosure, therefore, it may include information that does not constitute prior art known by those skilled in the art.

SUMMARY

According to an aspect of the present disclosure, there is provided a power integrated module, including at least one first bridge formed in a chip, wherein the first bridge includes:
a first upper bridge switch, comprising a first end, a second end and a control end;
a first lower bridge switch, comprising a first end, a second end and a control end;
a first electrode, electrically connected to the first end of the first upper bridge switch;
a second electrode, electrically connected to the second end of the first lower bridge switch; and
a third electrode, electrically connected to the second end of the first upper bridge switch and the first end of the first lower bridge switch,
wherein the first electrode, the second electrode and the third electrode are bar-type electrodes located above the first upper bridge switch and the first lower bridge switch, and
the power integrated module further comprises at least one second bridge formed in the chip, and the second bridge comprises:
a second upper bridge switch, comprising a first end, a second end and a control end;
a second lower bridge switch, comprising a first end, a second end and a control end;
a fourth electrode, electrically connected to the first end of the second upper bridge switch:
a fifth electrode, electrically connected to the second end of the second lower bridge switch; and
a sixth electrode, electrically connected to the second end of the second upper bridge switch and the first end of the second lower bridge switch,
wherein the third electrode is located between the first electrode and the second electrode, the sixth electrode is located between the fourth electrode and the fifth electrode, and
the fourth electrode is adjacent to the first electrode, or
the fourth electrode is adjacent to the second electrode, or
the fifth electrode is adjacent to the first electrode, or
the fifth electrode is adjacent to the second electrode.

According to an aspect of the present disclosure, there is provided a power integrated module, including at least one first bridge formed in a chip, wherein the bridge includes:
a first upper bridge switch, comprising a first end, a second end and a control end:
a first lower bridge switch, comprising a first end, a second end and a control end:
a first electrode, electrically connected to the first end of the first upper bridge switch:
a second electrode, electrically connected to the second end of the first lower bridge switch; and
a third electrode, electrically connected to the second end of the first upper bridge switch and the first end of the first lower bridge switch,
wherein the first electrode, the second electrode and the third electrode are bar-type electrodes arranged side by side, and located above the first upper bridge switch and the first lower bridge switch, and
the power integrated module further comprises at least one second bridge formed in the chip, and the second bridge comprises:
a second upper bridge switch, comprising a first end, a second end and a control end;
a second lower bridge switch, comprising a first end, a second end and a control end;
a fourth electrode, electrically connected to the first end of the second upper bridge switch:
a fifth electrode, electrically connected to the second end of the second lower bridge switch; and
a sixth electrode, electrically connected to the second end of the second upper bridge switch and the first end of the second lower bridge switch,
wherein the fourth electrode, the fifth electrode and the sixth electrode are located on extension lines of the second electrode, the first electrode and the third electrode respectively; or the fourth electrode, the fifth electrode and the sixth electrode are located on extension lines of the first electrode, the second electrode and the third electrode respectively.

In order to further understand the features and technical contents of the present disclosure, the following detailed description related to the present disclosure and the accompanying drawings may be referred to. However, the detailed description and accompanying drawings herein are merely illustrative of the present disclosure, not intend to limit the scope of the claims of the present disclosure.

BRIEF DESCRIPTION OF THE DRAWINGS

The above and other features and advantages of the present disclosure will become more apparent by description of exemplary implementations of the present disclosure in detail by a reference of the accompanying drawings.

DETAILED DESCRIPTION

Figure 1:
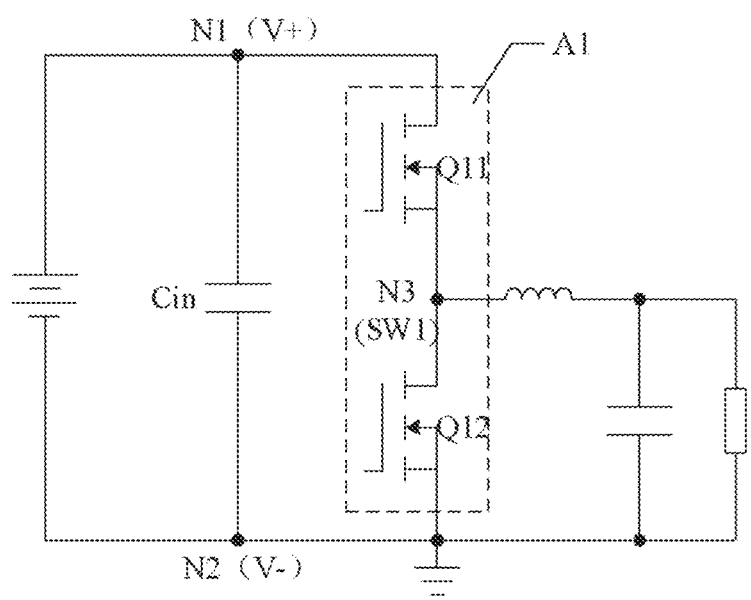
FIG. 1 is a circuit schematic diagram of a power integrated module according to an exemplary implementation of the present disclosure.

Example implementations will now be described in further detail with reference to the accompanying drawings. The example implementation, however, may be embodied in various forms, and should not be construed as being limited to the implementations set forth herein. Rather, these implementations are provided so that the present invention will become thorough and complete, and will fully convey the concept of the inventive concept to those skilled in the art. Similar reference numerals denote the same or like structures throughout the accompanying drawings, and thus repeated description thereof will be omitted.

In addition, the described features, structures or characters may be combined in one or more embodiments in any suitable manner. In the following description, numerous specific details are provided so as to allow a full understanding of the embodiments of the present disclosure. However, those skilled in the art will recognize that the technical solutions of the present disclosure may be implemented without one or more of the specific details, or other structures, parts, steps, methods and so on may be used. In other cases, the well-known structures, parts or operations are not shown or described in detail to avoid obscuring various aspects of the present disclosure.

As shown in FIG. 1, the power integrated module provided according to the present exemplary implementation at least includes a first bridge A1. In the embodiment, the first bridge A1 may include a first upper bridge switch Q11 and a first lower bridge switch Q12. The first upper bridge switch Q11 may include a first end, a second end and a control end. The first lower bridge switch Q12 may include a first end, a second end and a control end. The first ends, the second ends and the control ends may be drain electrodes, source electrodes and gate electrodes respectively. It should be noted that, according to the different types of switches, the first ends, the second ends and the control ends may be source electrodes, drain electrodes and gate electrodes respectively. As shown in FIG. 1, the first bridge A1 may further include a first electrode N1, a second electrode N2 and a third electrode N3. In the embodiment, the first electrode N1 is electrically connected to the first end of the first upper bridge switch Q11, and the first electrode N1 may be for example a positive input V+. The second electrode N2 is electrically connected to the second end of the first lower bridge switch Q12, and the second electrode N2 may be for example a negative input V−. The third electrode N3 is electrically connected to the second end of the first upper bridge switch Q11 and the first end of the first lower bridge switch Q12, and the third electrode N3 may be for example a midpoint SW1 of the first bridge. As shown in FIG. 1, in the present exemplary implementation, the first upper bridge switch Q11 and the first lower bridge switch Q12 of the first bridge A1 may operate in a high frequency high speed switch state, therefore a bus capacitor Cin may be additionally provided nearby to reduce loop inductance, to reduce voltage spikes due to a high speed current change rate di/dt of the loop inductor in switching processes, so as to reduce voltage stresses of the first upper bridge switch Q11 and the first lower bridge switch Q12. The "bridge" in one embodiment includes functional units and combinations thereof that may form a function of switches in series, in the chip.

In the present exemplary implementation, the first bridge A1 in the power integrated module may be integrated in a semiconductor chip C. A plan structure and an enlarged section structure, along a line A-A, of the semiconductor chip C which integrates the circuit of the first bridge A1 may be shown as FIG. 2A and FIG. 2B respectively. The semiconductor chip C may include a semiconductor layer L1 and an interconnection layer L2 located above the semiconductor layer. In the embodiment, the semiconductor layer includes cells which are required for constituting the first upper bridge switch Q11 and the first lower bridge switch Q12. For example, in the present exemplary implementation, both the first upper bridge switch Q11 and the first lower bridge switch Q12 are planar devices. The first upper bridge switch Q11 may be formed by a plurality of first sub switches connected in parallel. Each of the first sub switches may be constituted by one cell or a plurality of cells in the semiconductor layer L1. Similarly, the first lower bridge switch Q12 may be formed by a plurality of second sub switches connected in parallel. Each of the second sub switches may be constituted by one cell or a plurality of cells in the semiconductor layer L1. The interconnect layer L2 may include conductive layers and necessary insulating layers, which is mainly responsible for connecting the cells in the semiconductor layer L1 in parallel to form the first upper bridge switch Q11 and the first lower bridge switch Q12, and also responsible for interconnecting the first upper bridge switch Q11 and the first lower bridge switch Q12 and interconnecting the first upper bridge switch Q11 and the first lower bridge switch Q12 and the electrodes. For example, the first electrode N1, the second electrode N2 and the third electrode N3 are formed in the interconnection layer. However, the present disclosure is not limited thereto.

Figure 2A:
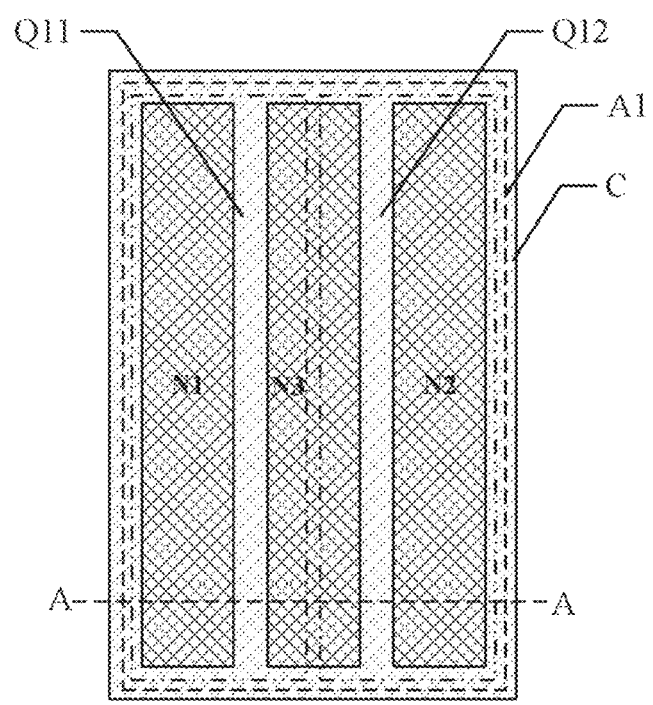
FIG. 2A is a plan schematic diagram of a power integrated module according to an exemplary implementation of the present disclosure.
Figure 2B:
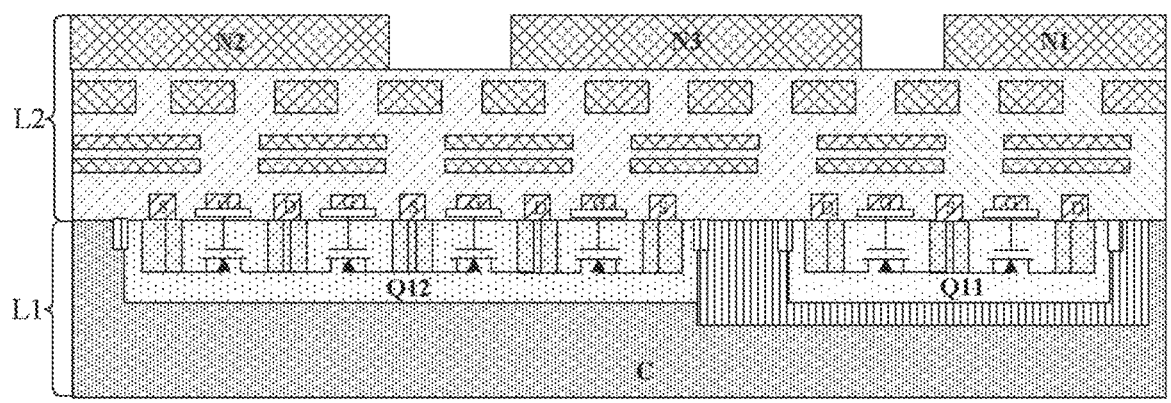
FIG. 2B is an enlarged section schematic diagram, along a line A-A, of the power integrated module as shown in FIG. 2A.
Figure 3:
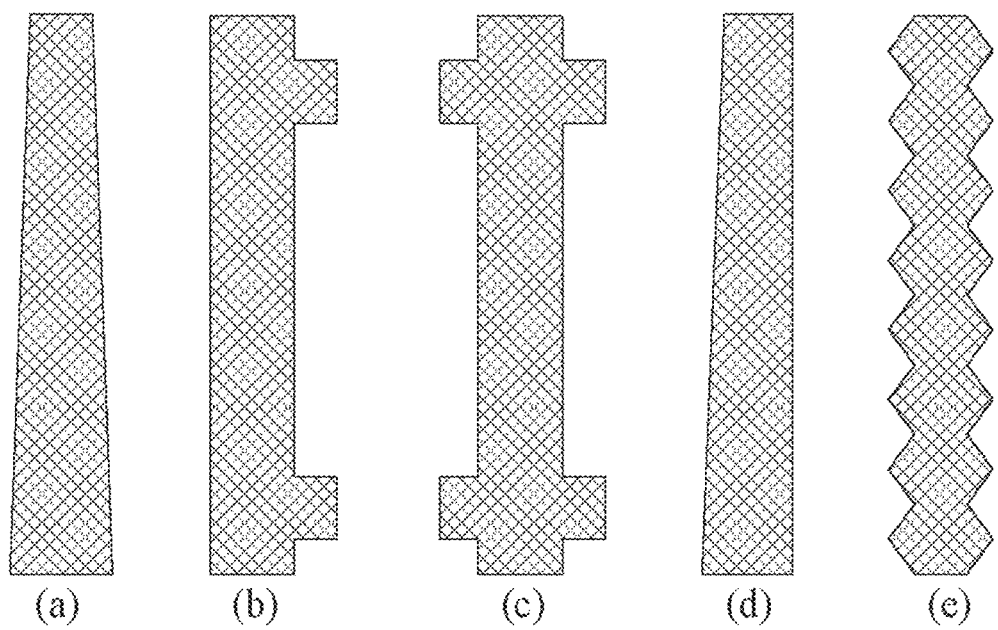
FIG. 3 is a structural schematic diagram of a bar-type electrode according to an exemplary implementation of the present disclosure.

As shown in FIG. 2A and FIG. 2B, in one exemplary embodiment of the present disclosure, the first electrode N1, the second electrode N2 and the third electrode N3 above may be bar-type electrodes arranged side by side, i.e., the first electrode N1, the second electrode N2 and the third electrode N3 are parallel to each other. However, it should be noted that, the shape of the bar-type electrodes in the present exemplary implementation is not limited to the above regular rectangle as shown in FIG. 2A, it may include various variant shapes. For example, all shapes (a)-(e) as shown in FIG. 3 may be regarded as a bar-type shape in the present disclosure, for example, used for the bar-type electrodes or a bar-shape area of a driving circuit, or the like. In addition, the first electrode N1, the second electrode N2 and the third electrode N3 may be not completely parallel to each other in other embodiments. Shapes of the first electrode N1, the second electrode N2 and the third electrode N3 may be the same, or be different, which is not specially limited in the present exemplary embodiment.

Figure 4:
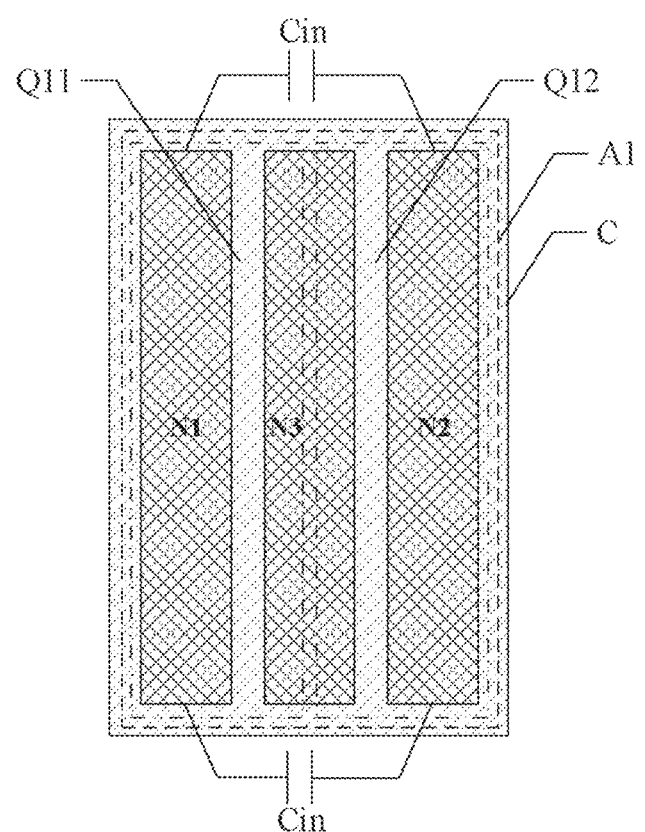
FIG. 4 is a plan schematic diagram of a power integrated module according to an exemplary implementation of the present disclosure.

As shown in FIG. 4, in the present exemplary implementation, both ends of the bar-type electrodes arranged side by side respectively extend to (or approach) an upper edge and a lower edge of the semiconductor chip C. It shall be understood that items of the upper edge and lower edge here are used only for convenience, which really means two sides of the semiconductor chip C as shown in plan schematic diagrams of the power integrated modules according to exemplary implementations of the present disclosure. Both ends of both the first electrode N1 and the second electrode N2 may have terminals led out to be connected to the bus capacitor Cin (the bus capacitor may be formed by a plurality of capacitors connected in series/in parallel, or it may be a single capacitor, which is not specially defined in the present exemplary embodiment). However, it should be noted that, in other exemplary embodiments of the present disclosure, the first electrode N and the second electrode N2 may respectively have only one end connected to the bus capacitor Cin, which is not specially defined in the present exemplary embodiment. Compared with electrode structures of other shapes and arrangement manners, the bar-type electrodes arranged side by side in the present implementation may achieve a smaller loop inductance between capacitors and bridge. At least two small high frequency current loops may be in parallel to achieve a smaller equivalent loop. In some embodiments, under the same power design, the loop inductance may be reduced by more than 50% compared with the prior art, which is quite beneficial to achieving high performance under high frequency operations. In addition, in the present exemplary implementation, in order to further optimize the loop and avoid increasing the loop inductance, the third electrode N3 may be located between the first electrode N1 and the second electrode N2, which may optimize interconnection impedance between the first upper bridge switch Q11 and the first lower bridge switch Q12. However, other arrangements of the first electrode N1, the second electrode N2 and the third electrode N3 also belong to the protection scope of the present disclosure.

As described above, in the present exemplary embodiment, the power integrated module may further include at least two bus capacitors Cin. Each of the two bus capacitors Cin is electrically connected to the first electrode N1 and the second electrode N2. For example, as shown in FIG. 4, the two bus capacitors Cin are respectively disposed at two ends of the first electrode N1 and the second electrode N2. Since the bus capacitors Cin are electrically connected to the first bridge A1 formed in the semiconductor chip, and different location arrangement will affect the loop inductance of the power integrated module, more optimal small loop interconnection may be achieved by a more excellent structure design. For this purpose, there may be several optimization schemes in the present exemplary implementation as follows.

Figure 5A:
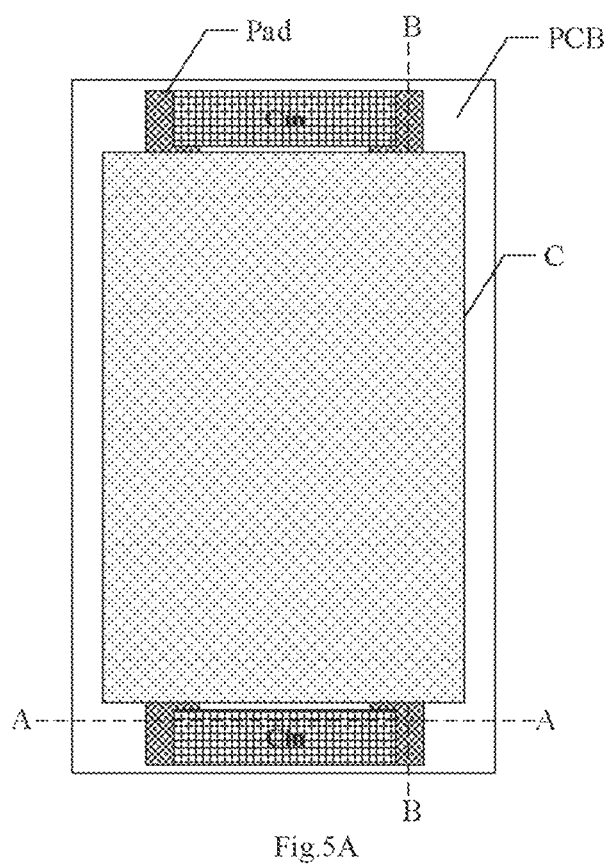
FIG. 5A is a plan schematic diagram of a power integrated module according to an exemplary implementation of the present disclosure.
Figure 5B:
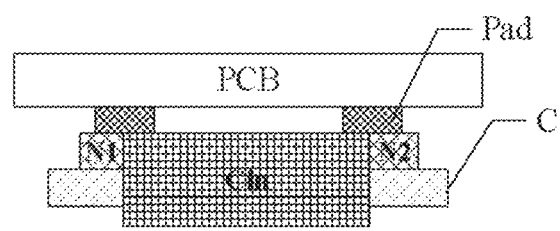
FIG. 5B is a section schematic diagram, along a direction A-A, of the power integrated module as shown in FIG. 5A.
Figure 5C:
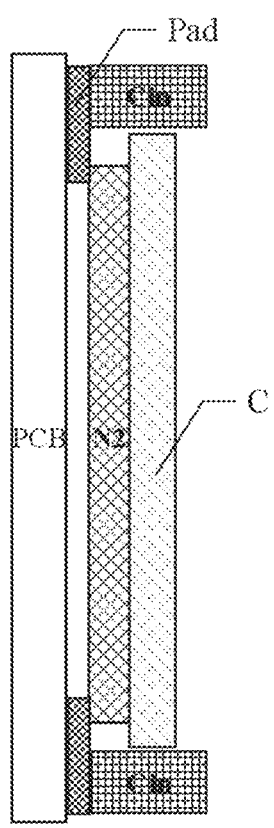
FIG. 5C is a section schematic diagram, along a direction B-B, of the power integrated module as shown in FIG. 5A.

As shown in FIGS. 5A~5C, the power integrated module may be placed on a PCB circuit board. Respective electrodes in the power integrated module, such as the first electrode N1, the second electrode N2 and the third electrode N3 may be interconnected to the PCB circuit board by welding (e.g. pin pads "Pad" as shown in FIG. 5A), which includes various connection manners such as direct contact connection or indirectly electrically connection. In the present exemplary implementation, the bus capacitors Cin may be respectively provided at the two ends of the first electrode N1 and the second electrode N2. A projection of the semiconductor chip C with respect to the PCB circuit board does not overlap the projections of the bus capacitors Cin with respect to the PCB circuit board. For example, as shown in FIGS. 5A~5C, the two bus capacitors Cin may be located outside the upper edge and the lower edge of the semiconductor chip C, and may be arranged side by side with the semiconductor chip C. The electrodes of the bus capacitors Cin may be interconnected with the first electrode N1 and the second electrode N2 through a conductive layer (such as a metal layer) of the PCB circuit board. In this way, a quite small interconnection loop between capacitors and bridge may be achieved.

In FIGS. 5A~5C, the bus capacitors Cin and the chip C are all located on a surface of a carrier plate of the PCB circuit board. However, in the present disclosure, the carrier plate is not limited to the PCB circuit board, it may also be a ceramic substrate or a wire frame, and the like.

Figure 6A:
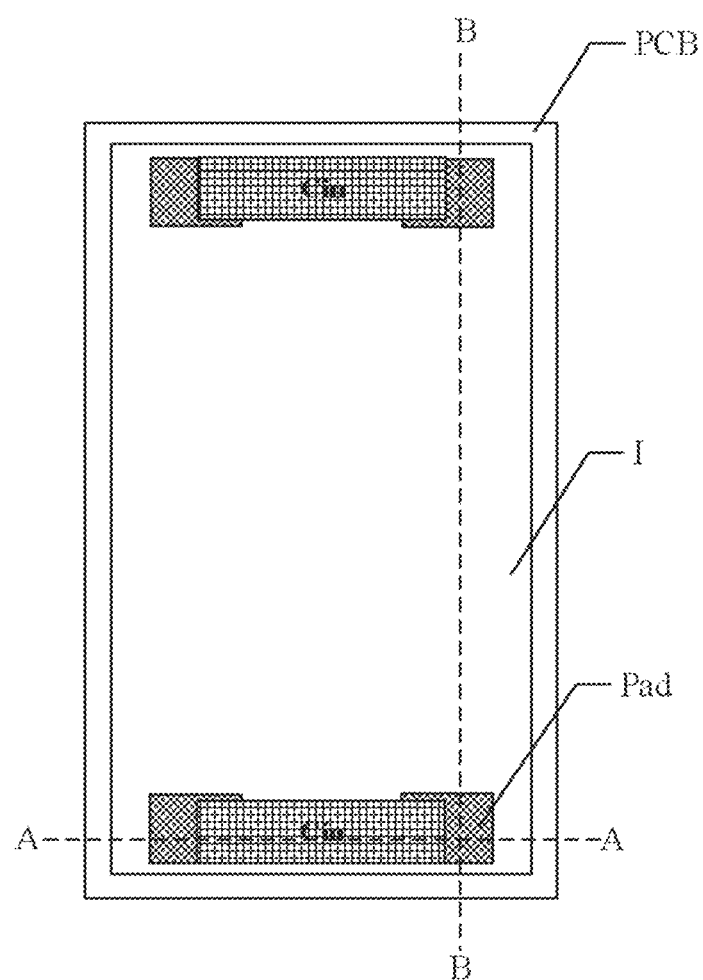
FIG. 6A is a plan schematic diagram of a power integrated module according to an exemplary implementation of the present disclosure.
Figure 6B:
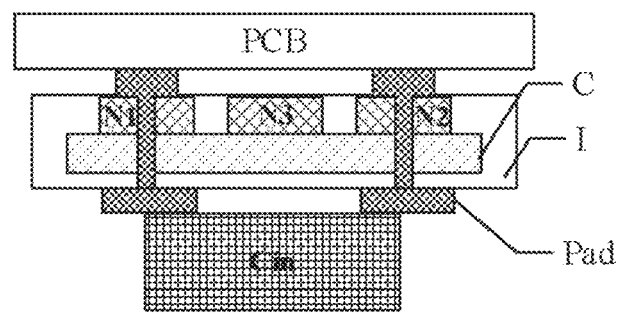
FIG. 6B is a section schematic diagram, along a direction A-A, of the power integrated module as shown in FIG. 6A.
Figure 6C:
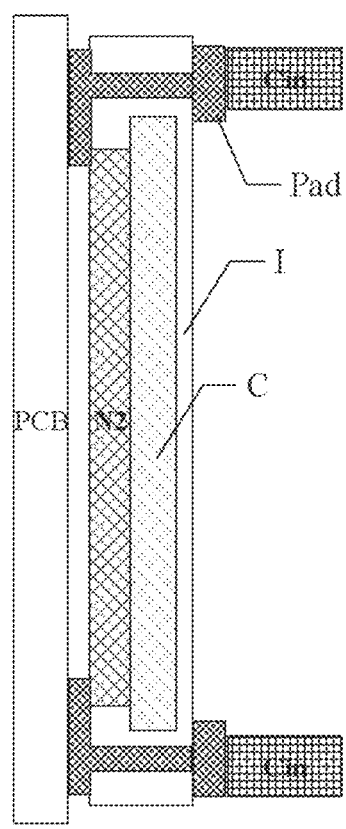
FIG. 6C is a section schematic diagram, along a direction B-B, of the power integrated module as shown in FIG. 6A.

In FIGS. 5A~5C, the bus capacitors Cin and the chip C are all located on the surface of the PCB circuit board. If the bus capacitors Cin occupy the areas of the PCB circuit board, which are employed for leading out respective electrodes in the power integrated module, corresponding interconnection loss may be increased. For this reason, as shown in FIGS. 6A~6C, in the present exemplary implementation, all the bus capacitors Cin may be provided above the chip C. That is, the first electrode N1, the second electrode N2 and the third electrode N3 are located on a first surface such as a front surface of the semiconductor chip C that faces the PCB circuit board, while the bus capacitor Cin is located on a second surface such as a back surface of the semiconductor chip C. An insulating layer I may be provided between the semiconductor chip C and the capacitance pad "Pad". In one embodiment, the first electrode N1 and the second electrode N2 may be electrically led out to the second surface of the semiconductor chip through holes, and electrically connected with the capacitors Cin. In this way, not only a quite small interconnection loop between capacitors and bridge may be guaranteed, but also the areas on the PCB circuit board, which are used for leading out respective electrodes in the power integrated module, may not be occupied by the bus capacitors Cin.

Figure 7A:
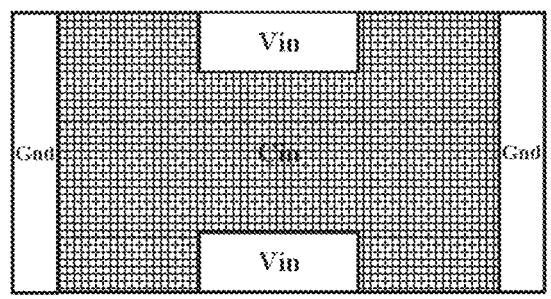
FIG. 7A is a schematic diagram of electrodes of an integrated capacitor according to an exemplary implementation of the present disclosure.
Figure 7B:
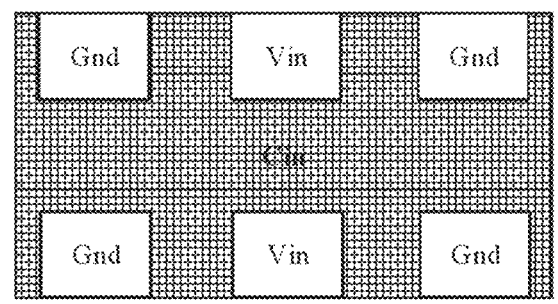
FIG. 7B is a schematic diagram of electrodes of an integrated capacitor according to an exemplary implementation of the present disclosure.
Figure 8A:
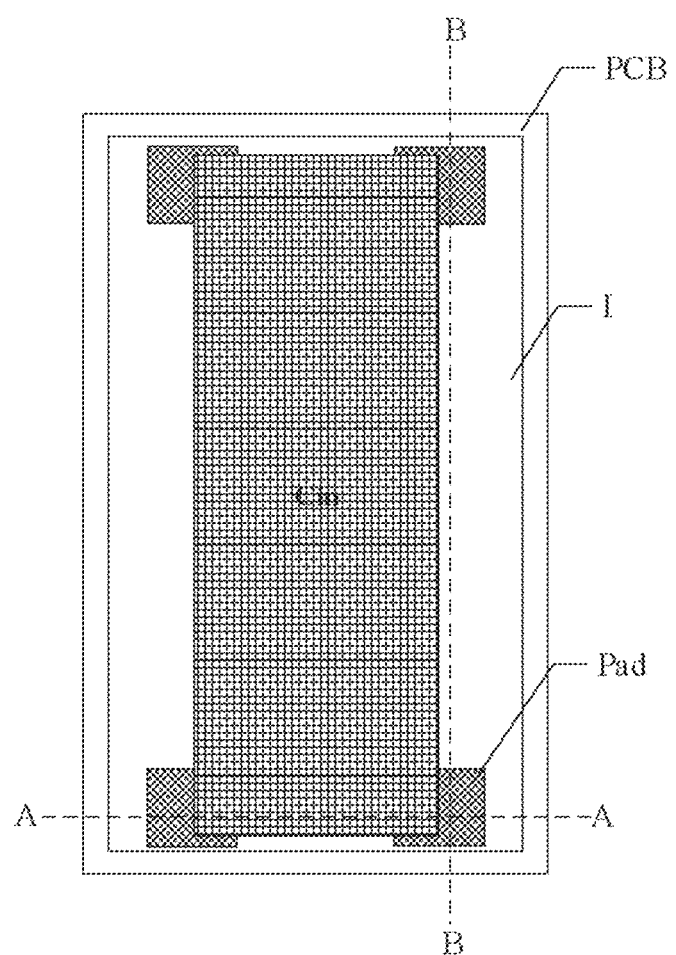
FIG. 8A is a plan schematic diagram of a power integrated module according to an exemplary implementation of the present disclosure.
Figure 8B:
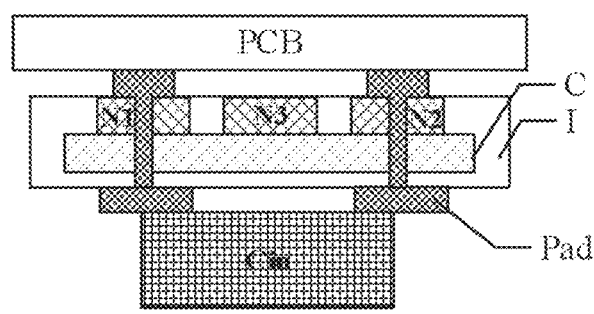
FIG. 8B is a section schematic diagram, along a direction A-A, of the power integrated module as shown in FIG. 8A.
Figure 8C:
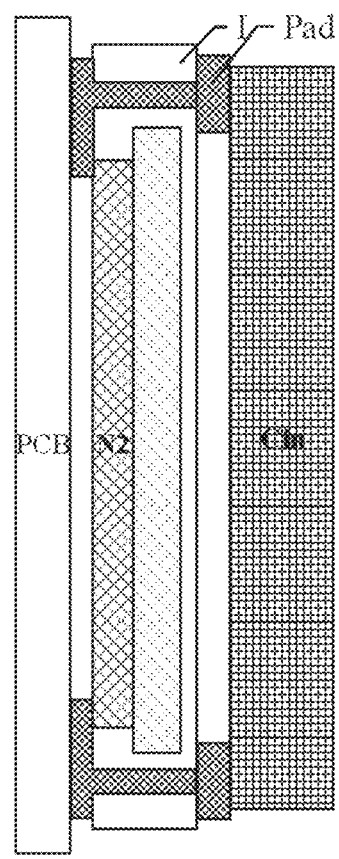
FIG. 8C is a section schematic diagram, along a direction B-B, of the power integrated module as shown in FIG. 8A.

In FIGS. 5A~5C and FIGS. 6A~6C, two or a plurality of bus capacitors Cin are employed, and the two or the plurality of capacitors may be located on both sides of the chip. In the present exemplary implementation, one or more integrated capacitors may be employed to replace the plurality of separate capacitors. An integrated capacitor with a plurality of output pins has relatively small equivalent series resistance (ESR) and equivalent series inductance (ESL), which may further reduce the loop inductance and capacitor loss, and may also improve assembly efficiency and reliability. As shown in FIGS. 7A and 7B, the number of the output pins of the integrated capacitor Cin may be greater than or equal to 4. FIGS. 8A~8C are detailed schematic diagrams of the power integrated module including the integrated capacitor Cin. It can be seen that capacitance requirement of the entire power integrated module may be met by only one integrated capacitor. Therefore, it is more convenient for production, achieves higher assembly efficiency, and avoids reliability problems due to a plurality of bus capacitors Cin.

The area of a chip determines current capacity of the chip. In order to extend to larger current applications, the chip area may be enlarged appropriately. The area involved with two adjacent electrodes will determine the size of the loop area. The larger the loop area is, the larger the loop inductance will be, and the more disadvantageously the circuit will work in high frequency. Therefore, the number of electrodes in a certain area of the chip (i.e., the distribution density of the electrodes) will greatly affect the inductance of the loop, thus affect characteristics of the circuit, such as voltage endurance capability of the switching elements and efficiency of the circuit. Therefore, in consideration of the distribution density of the electrodes, in a case where the area of the chip is increased, more electrodes may be provided, as described in details in following embodiments.

Figure 9A:
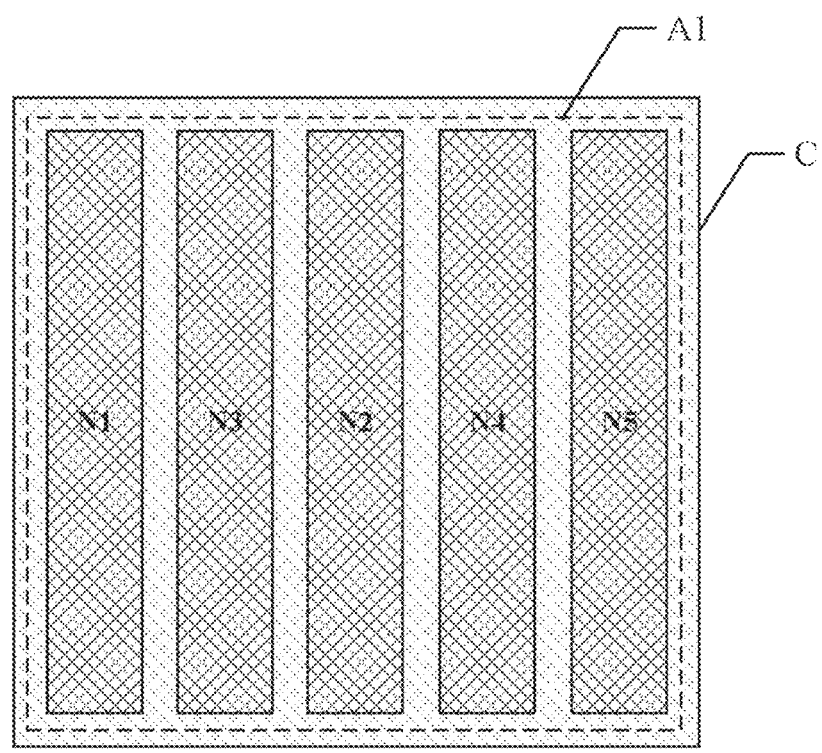
FIG. 9A is a plan schematic diagram of a power integrated module according to an exemplary implementation of the present disclosure.
Figure 9B:
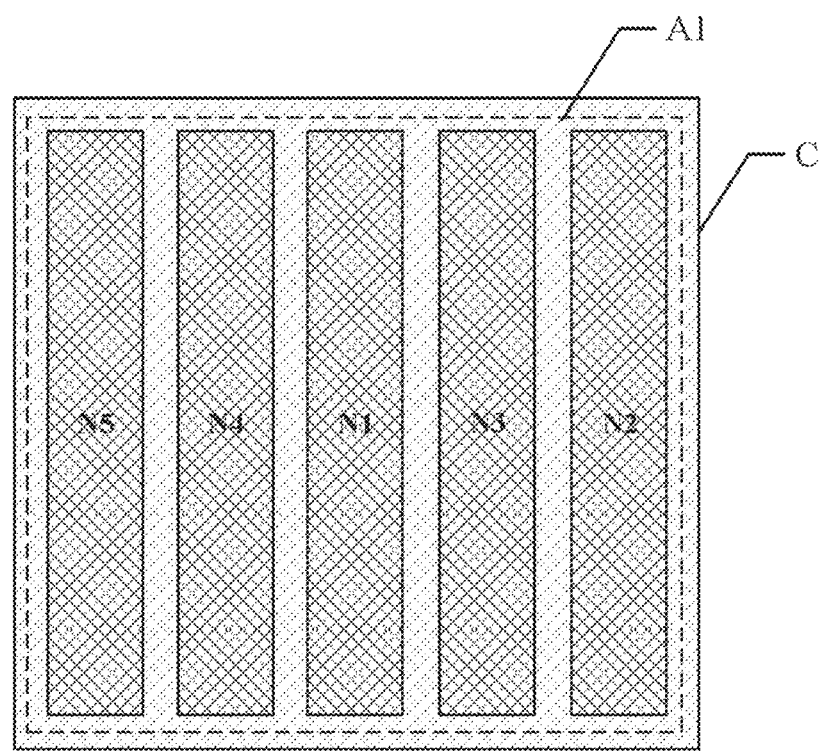
FIG. 9B is a plan schematic diagram of a power integrated module according to an exemplary implementation of the present disclosure.

As shown in FIG. 9A, in other exemplary embodiments of the present disclosure, the first bridge A1 may further include a fourth electrode N4 and a fifth electrode N5 or more electrodes, i.e., the first bridge A1 contains more cells in the chip. In the embodiment, the fourth electrode N4 may be electrically connected to the second end of the first upper bridge switch Q11 and the first end of the first lower bridge switch Q12. The fifth electrode N5 may be electrically connected to the first end of the first upper bridge switch Q111, and the fourth electrode N4 is located between the fifth electrode N5 and the second electrode N2. Alternatively, as shown in FIG. 9B, the fourth electrode N4 may be electrically connected to the second end of the first upper bridge switch Q1 and the first end of the first lower bridge switch Q12. The fifth electrode N5 may be electrically connected to the second end of the first lower bridge switch Q12, and the fourth electrode N4 is located between the fifth electrode N5 and the first electrode N1. The two orders of arrangement may not only ensure high frequency performance, but also may extend current capacity. In the exemplary embodiment, extendibility of the power integrated module may be further improved by the arrangement of more electrodes. However, the present disclosure is not limited thereto. The orders of the electrodes may change, and more electrodes may be employed for bridges.

Figure 10A:
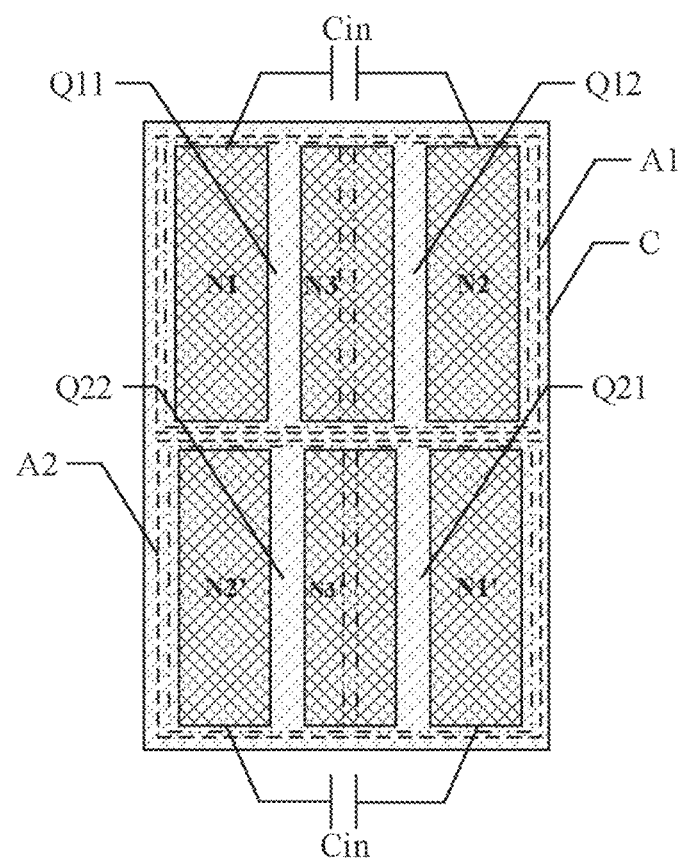
FIG. 10A is a plan schematic diagram of a power integrated module according to an exemplary implementation of the present disclosure.

As shown in FIG. 10A, in another exemplary implementation of the present disclosure, the power integrated module may further include a second bridge A2. The second bridge A2 forms on the same chip with the first bridge A1. Similar to the first bridge A1, the second bridge A2 may include a second upper bridge switch Q21, a second lower bridge switch Q22, a fourth electrode N1' (which, for example, may be a positive input V+), a fifth electrode N2' (which, for example, may be a negative input V−) and a sixth electrode N3' (which, for example, may be a midpoint SW2 of the second bridge). In the embodiment, the second upper bridge switch Q21 may be formed by a plurality of third sub switches formed in the chip connected in parallel. The second upper bridge switch Q21 includes a first end, a second end and a control end. The second lower bridge switch Q22 may be formed by a plurality of fourth sub switches formed in the chip connected in parallel. The second lower bridge switch Q22 includes a first end, a second end and a control end. The fourth electrode N1' is electrically connected to the first end of the second upper bridge switch Q21. The fifth electrode N2' is electrically connected to the second end of the second lower bridge switch Q22. The sixth electrode N3' is electrically connected to the second end of the second upper bridge switch Q21 and the first end of the second lower bridge switch Q22. Since the structure of the second bridge A2 is generally similar to that of the first bridge A1, which will not be repeated in the present exemplary implementation.

Figure 10B:
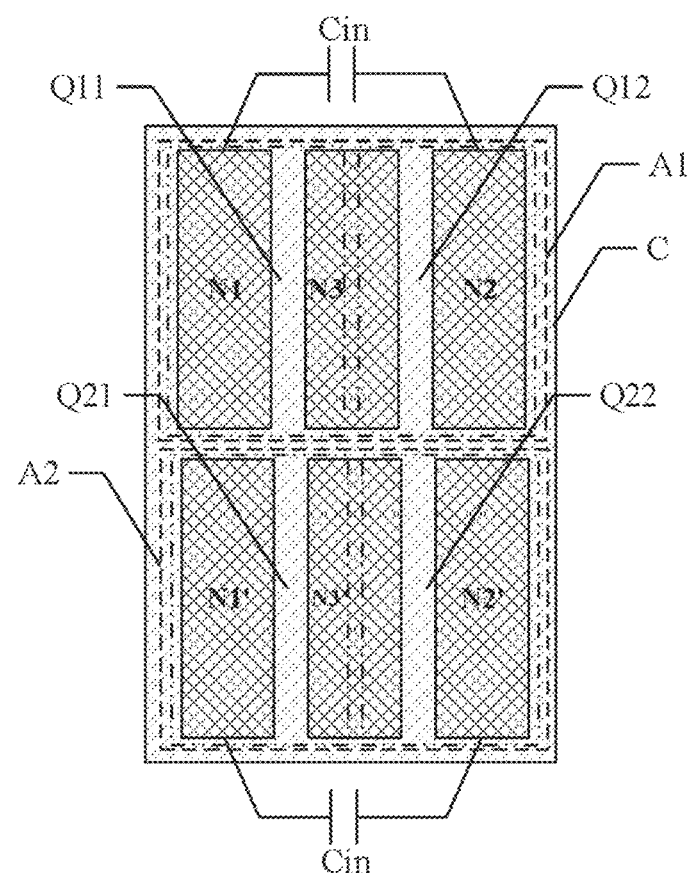
FIG. 10B is a plan schematic diagram of a power integrated module according to an exemplary implementation of the present disclosure.

As shown in FIG. 10A, in the present exemplary implementation, the fourth electrode N1', the fifth electrode N2' and the sixth electrode N3' are located on extension lines of the second electrode N2, the first electrode N1 and the third electrode N3 respectively. It may also be as shown in FIG. 10B, the fourth electrode N1', the fifth electrode N2' and the sixth electrode N3' are located on the extension lines of the first electrode N1, the second electrode N2 and the third electrode N3 respectively. In the embodiment, the first electrode N1 and the second electrode N2 in the first bridge A1 respectively have only one end connected to one bus capacitor Cin. The fourth electrode N1' and the fifth electrode N2' in the second bridge A2 also respectively have only one end connected to another bus capacitor Cin. But the present disclosure is not limited thereto.

Figure 10C:
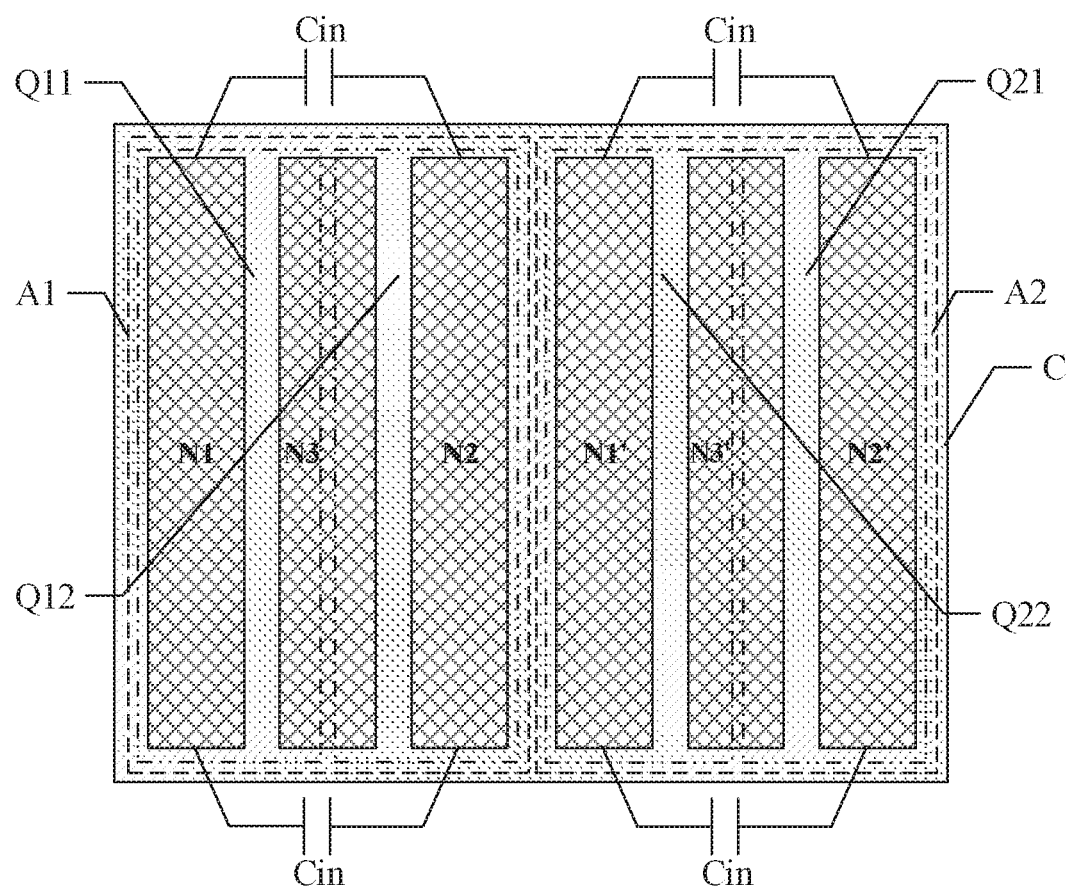
FIG. 10C is a plan schematic diagram of a power integrated module according to an exemplary implementation of the present disclosure.

As shown in FIG. 10C, in the present implementation, the fourth electrode N1', the fifth electrode N2' and the sixth electrode N3' may also be arranged side by side with the second electrode N2, the first electrode N1 and the third electrode N3. In the present exemplary implementation, the order of arrangement of the fourth electrode N1', the fifth electrode N2' and the sixth electrode N3' may be the same as or different from that of the first electrode N1, the second electrode N2 and the third electrode N3. For example, as shown in FIG. 10C, the sixth electrode N3' may be located between the fourth electrode N1' and the fifth electrode N2', and the fourth electrode N1' is adjacent to the second electrode N2. In other exemplary embodiments, the sixth electrode N3' may be located between the fourth electrode N1' and the fifth electrode N2', and the fifth electrode N2' is adjacent to the second electrode N2, or the like, which is not specially defined in the present exemplary embodiment.

In the power integrated module as shown in FIGS. 10A~10C, the third electrode N3 of the first bridge A1 may be separate from the sixth electrode N3' of the second bridge A2. That is, the third electrode N3 and the sixth electrode N3' may be not directly interconnected. Therefore, driving signals of the first upper bridge switch Q11 and the first lower bridge switch Q12 of the first bridge A1 may be separate from, rather than shared with, that of the second upper bridge switch Q21 and the second lower bridge switch Q22 of the second bridge A2. Such power integrated module may be provided with two sets of connecting terminals for the bridges. When seen from the outside of the power integrated module, the two bridges may be looked as two separate bridges, which may be applied in two separate Buck conversion circuit(s) and/or Boost conversion circuit(s), and may also be applied in a full bridge circuit, or other circuits. Since the integration density of the power integrated module is higher, it is more applicable for high frequency applications. In other exemplary embodiments of the present disclosure, the third electrode N3 of the first bridge A1 and the sixth electrode N3' of the second bridge A2 may be shorted together, to improve current capacity of the circuit. Such power integrated module may only be provided with one set of connecting terminals for the bridges. When seen from the outside of the power integrated module, the two bridges may be looked as one bridge as a whole. Therefore, the power integrated modules as shown in FIGS. 10A~10C have more flexible application ability, besides excellent performance in high frequency similar to that of the power integrated module as shown in FIGS. 2A~2B.

Figure 11:
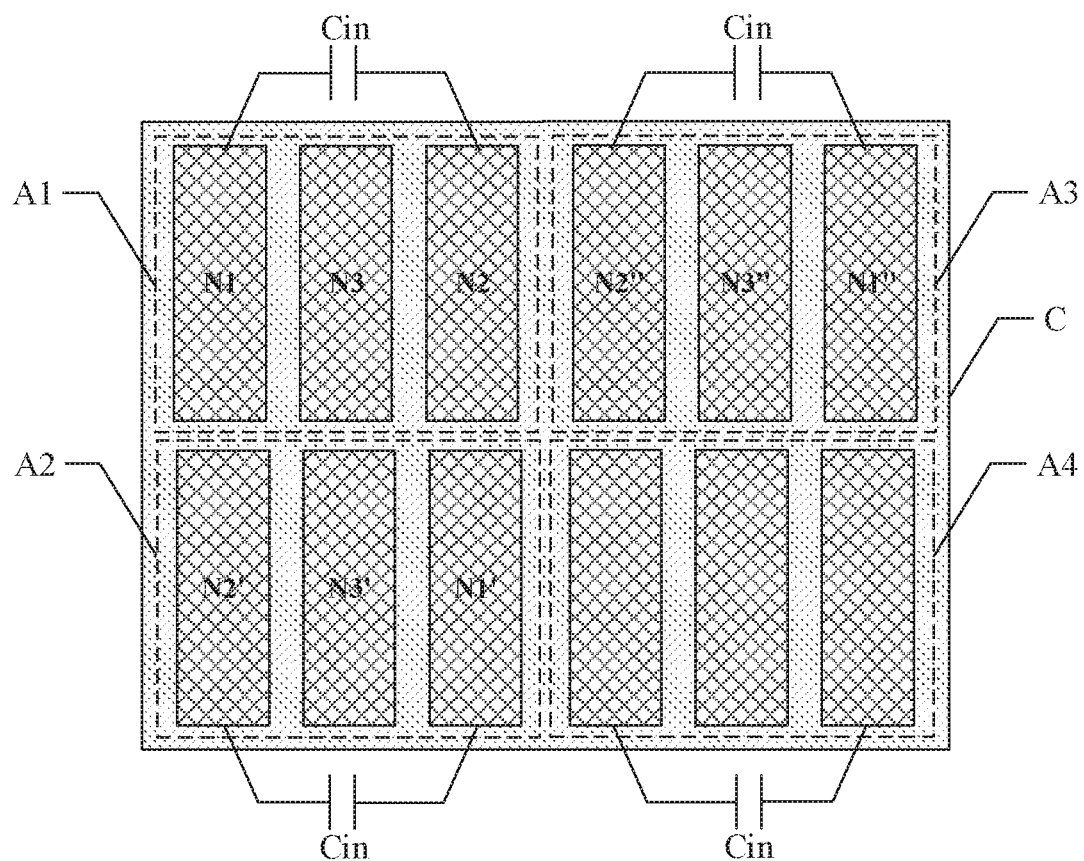
FIG. 11 is a plan schematic diagram of a power integrated module according to an exemplary implementation of the present disclosure.

In the power integrated module as shown in FIGS. 2A~2B, The area involved with the first electrode N1, the third electrode N3 and the second electrode N2 which are adjacent on the semiconductor chip, determines the size of the current loop. For example, the larger the area is involved with, the larger the loop inductance will be, and the more disadvantageously the circuit will work in high frequency. Therefore, the power integrated module as shown in FIGS. 2A~2B has the current capacity limitation (the area of the semiconductor chip determines the current capacity). With technical schemes as shown in FIGS. 10A~10C, the performance in high frequency may be ensured, and the power integrated module may be extended to larger current applications. In more exemplary embodiments of the present disclosure, the technical schemes as shown in FIGS. 10A~10C may be combined to achieve the power integrated module as shown in FIG. 11. In FIG. 11, the power integrated module may further include more bridges such as a third bridge A3, a fourth bridge A4, a fifth bridge A5 and a sixth bridge or the like, besides the above first bridge A1 and the second bridge A2, to further improve current capacity of the circuit. The structure of the above more bridges such as the third bridge A3, the fourth bridge A4, the fifth bridge and the sixth bridge or the like is generally similar to that of the first bridge A1, and all the bridges may be formed in the same semiconductor chip. When seen from the outside of the power integrated module, the plurality of bridges in the power integrated module may respectively play a role of one bridge each, or may be connected in parallel to play a role of one bridge as a whole, which is not limited in the present disclosure.

Figure 12A:
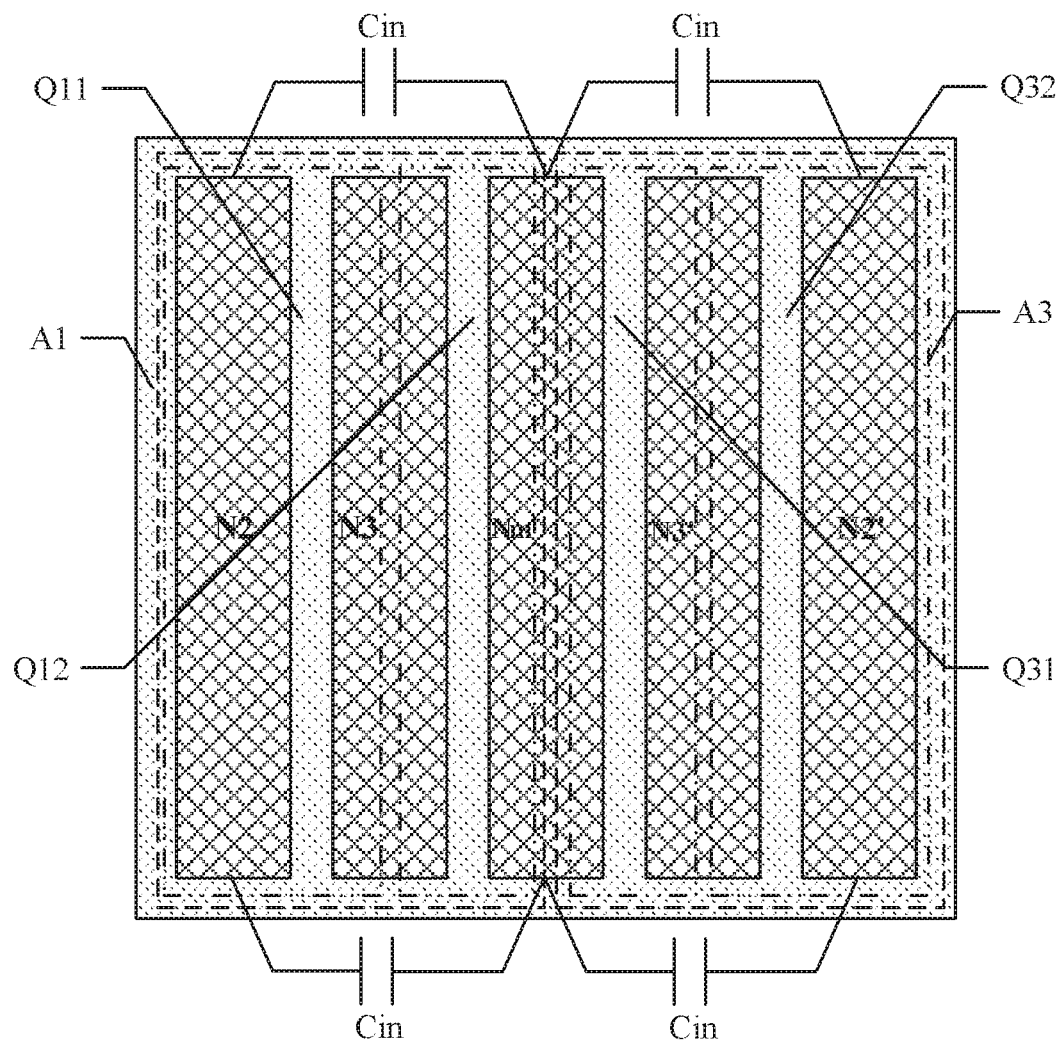
FIG. 12A is a plan schematic diagram of a power integrated module according to an exemplary implementation of the present disclosure.
Figure 12B:
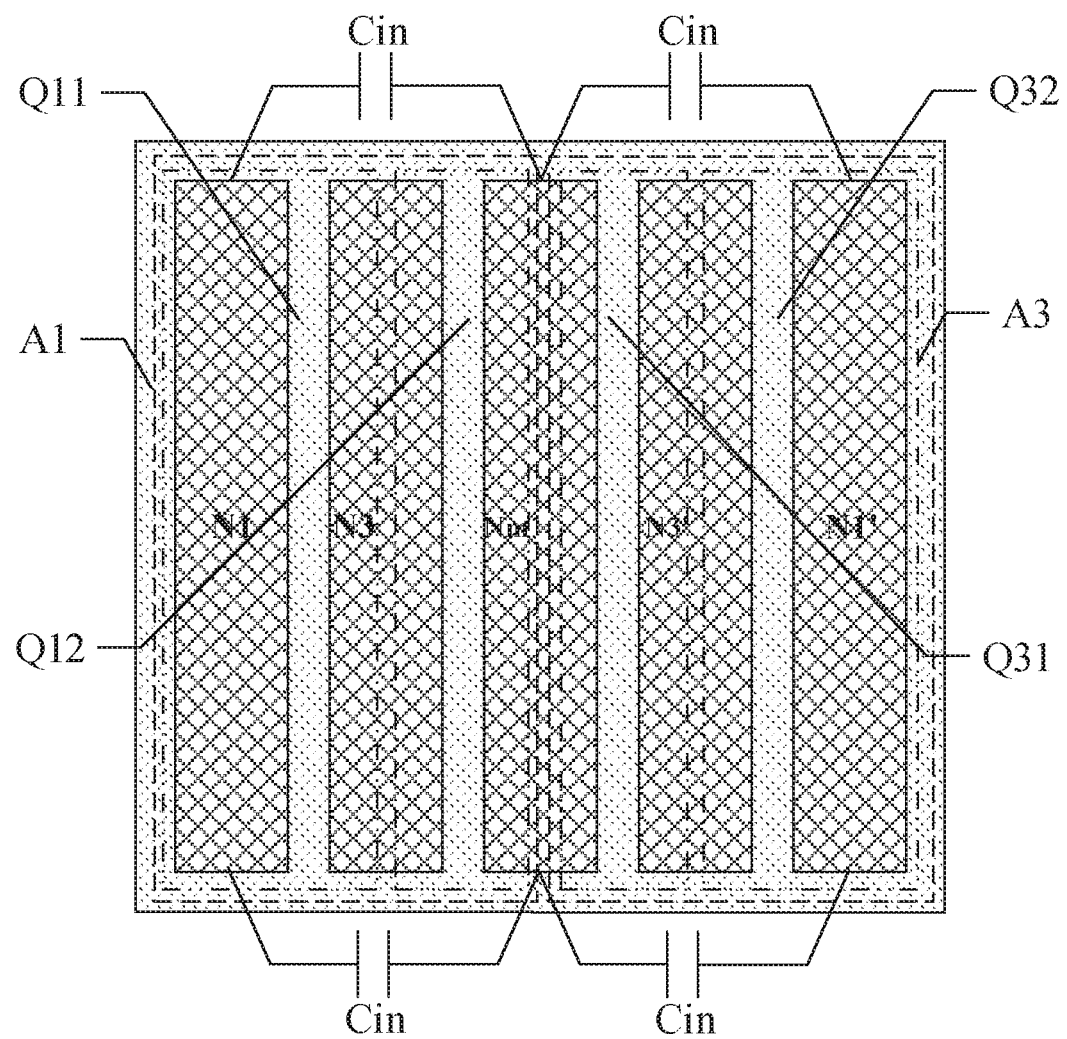
FIG. 12B is a plan schematic diagram of a power integrated module according to an exemplary implementation of the present disclosure.

As shown in FIG. 12A and FIG. 12B, in another exemplary embodiment of the present disclosure, in order to reduce the isolation area of different electrodes, that is to say, to take advantage of surface resource of the semiconductor chip more fully, the power integrated module as shown in FIG. 10C may be further optimized. Taking that in FIG. 12A as an example, the first electrode N1 and the fourth electrode N1' may be merged into one merged electrode Nm, and the electrodes are arranged side by side in an order of arrangement of the second electrode N2, the third electrode N3, the merged electrode Nm, the sixth electrode N3' and the fifth electrode N2'. Alternatively, taking that in FIG. 12B as an example, the second electrode N2 and the fifth electrode N2' may be merged into one merged electrode Nm. and the electrodes are arranged side by side in an order of arrangement of the first electrode N1, the third electrode N3, the merged electrode Nm, the sixth electrode N3' and the fourth electrode N1'. Therefore, the number of electrodes may be reduced, to take advantage of the semiconductor chip more fully. Each bridge may still be used separately (the power integrated module includes a plurality of bridges), or the first electrodes, the second electrodes, the third electrodes of two or more bridges may be connected together (the power integrated module includes a few bridges or even one bridge), to provide flexibility of application. This conception may also be applied in the power integrated module as shown in FIG. 11 or other power integrated modules, which is not specially defined by the present exemplary embodiment.

Figure 13A:
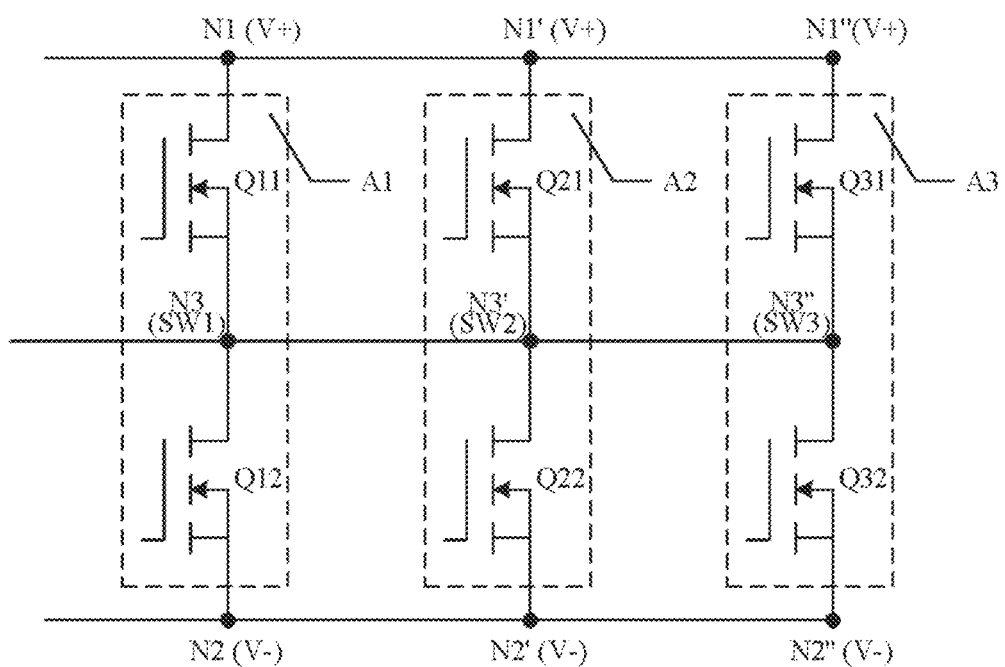
FIG. 13A is a circuit diagram of a connection relationship among bridges according to an exemplary implementation of the present disclosure.
Figure 13B:
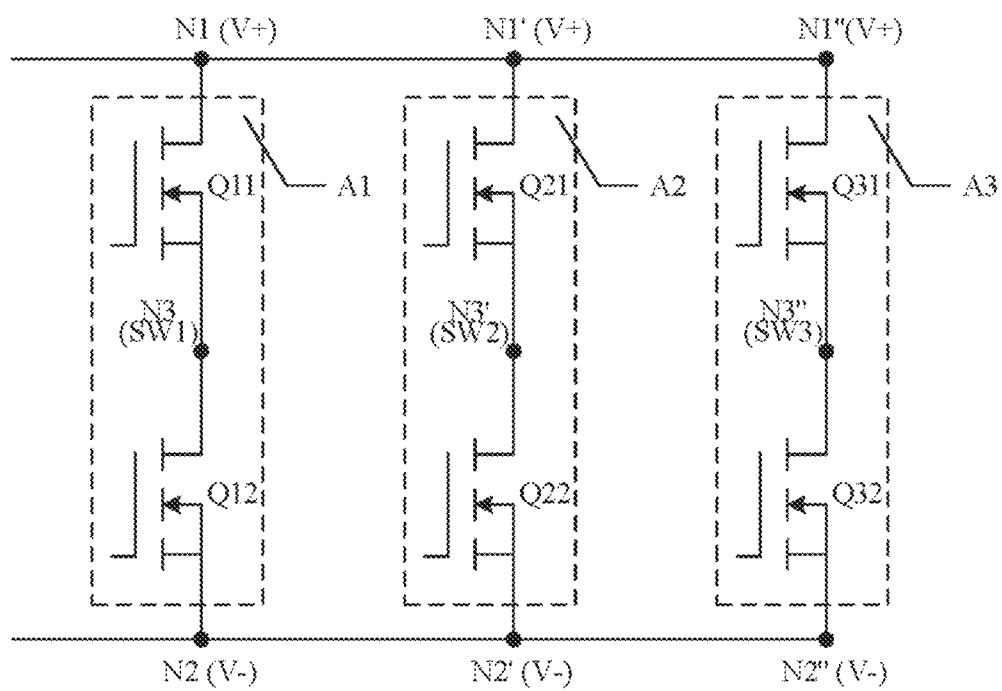
FIG. 13B is a circuit diagram of a connection relationship among bridges according to an exemplary implementation of the present disclosure.

FIG. 13A and FIG. 13B further illustrate relationships between different bridges in the above exemplary embodiments by circuit diagrams. However, the present disclosure is not limited to these two connection manners. The circuit diagram as shown in FIG. 13A achieves extending current capacity of the circuit by a plurality of bridges connected in parallel. In the circuit diagram as shown in FIG. 13B, respective bridges are separate from each other, and such power integrated module may be applied in separate Buck conversion circuit(s) and/or Boost conversion circuit(s), and may also be applied in a full bridge circuit, or other circuits.

Figure 14:
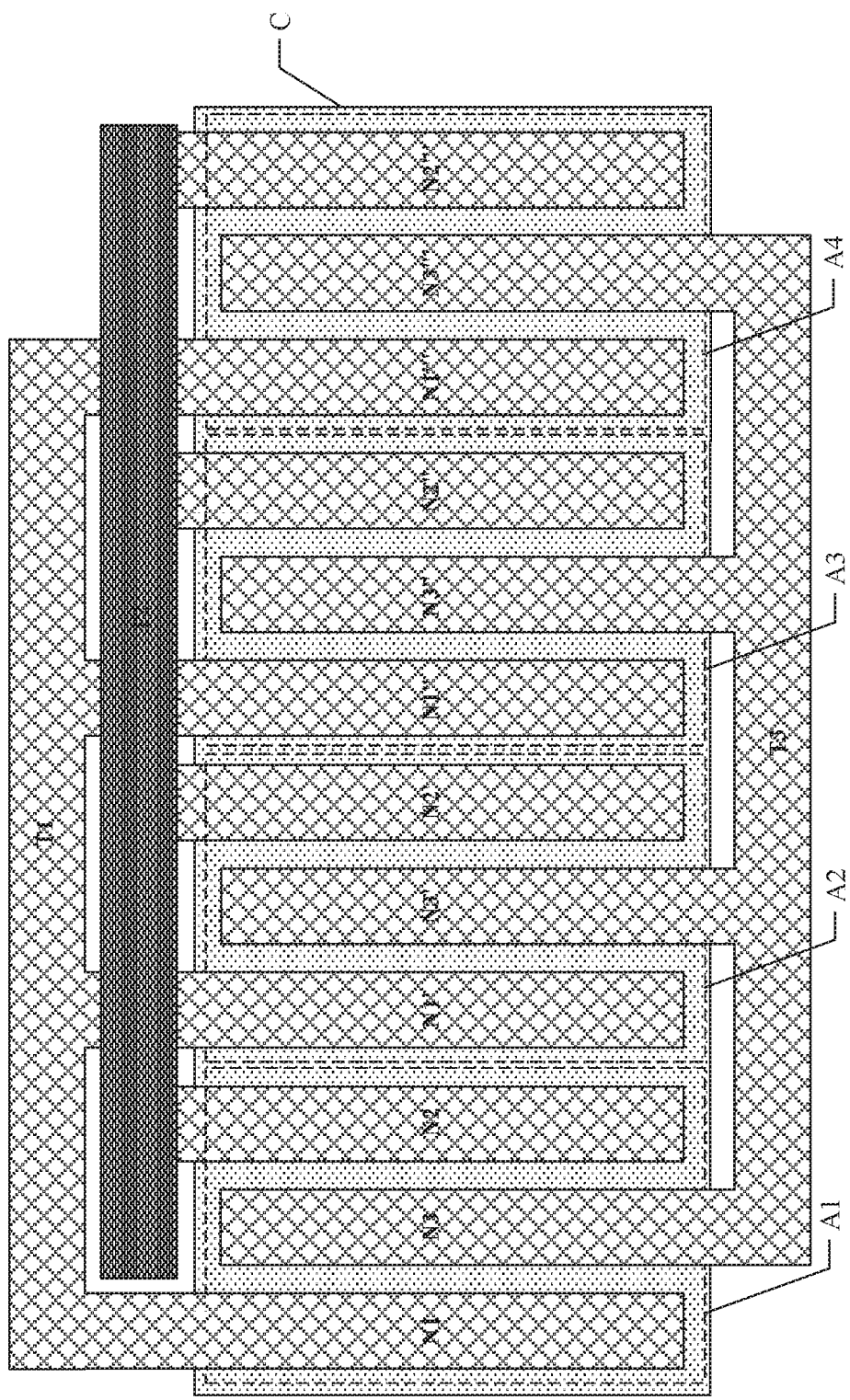
FIG. 14 is a plan schematic diagram of a power integrated module according to an exemplary implementation of the present disclosure.

In above power integrated modules, to achieve smaller interior interconnection impedance, sizes of respective electrodes in the power integrated module are usually quite small, such as, with a width smaller than 0.3 mm, therefore they are difficult to be used directly on the traditional PCB. As shown in FIG. 14, the present exemplary implementation may further include a first bus terminal T1, a second bus terminal T2 and a third bus terminal T3. In the embodiment, the first bus terminal T1, the second bus terminal T2 and the third bus terminal T3 are all located outside the projection of the semiconductor chip C, i.e., in a bus area. The first bus terminal T1 may be electrically connected to the first electrode N1 (which may further include the electrode N1' and an electrode N1" and the like) through a conductor. The second bus terminal T2 may be electrically connected to the second electrode N2 (which may further include the electrode N2' and an electrode N2" and the like) through a conductor. The third bus terminal T3 may be electrically connected to the third electrode N3 (which may further include the electrode N3' and an electrode N3" and the like) through a conductor. If equivalent resistance and inductance corresponding to one electrode length of respective bridges in the power integrated module are represented by R and L respectively, the conflux manner as shown in FIG. 14 will generate a large impedance loss because each electrode will generate equivalent impedance reaching a formula of (R+L). Therefore, it is very disadvantageous to high frequency large current applications.

Figure 15:
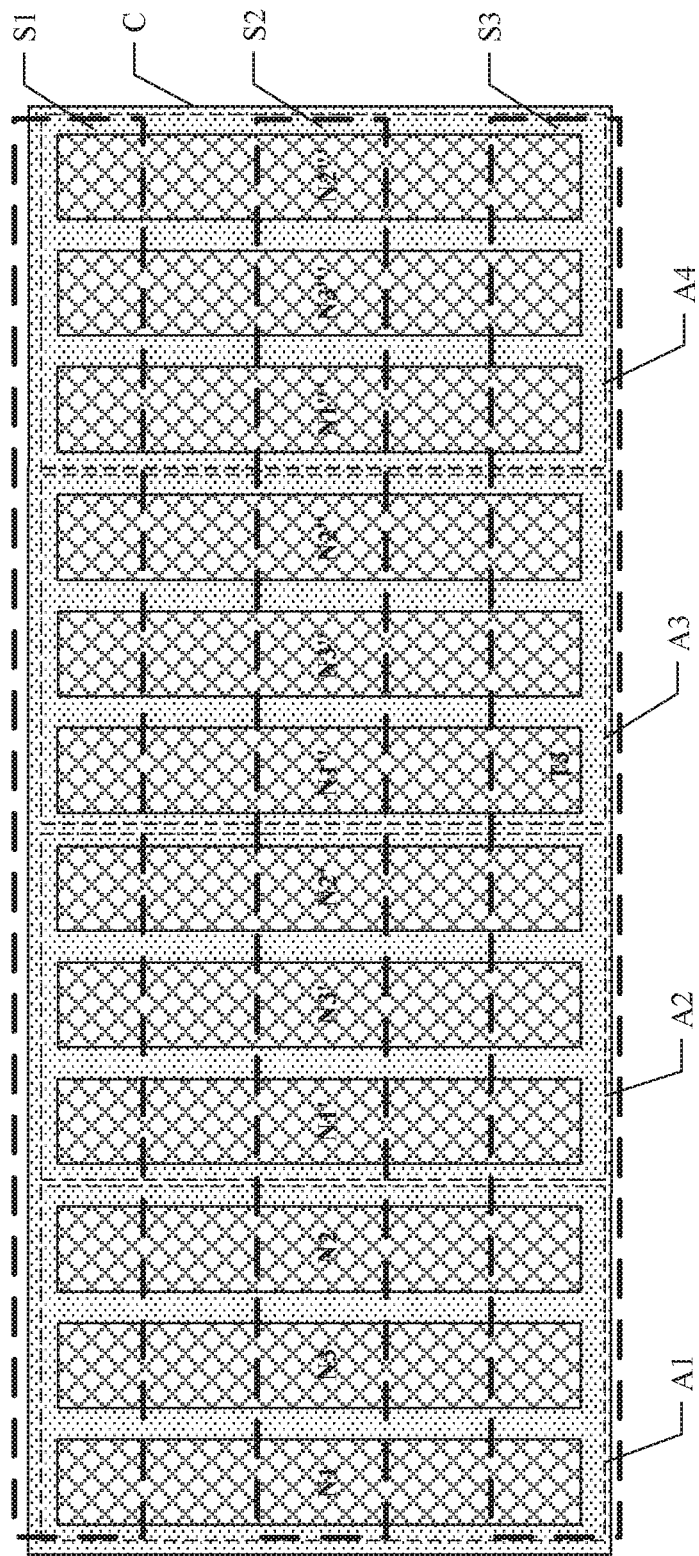
FIG. 15 is a plan schematic diagram of a power integrated module according to an exemplary implementation of the present disclosure.

As shown in FIG. 15, in order to optimize the power integrated module as shown in FIG. 14, in the present exemplary implementation, the bus area may include a first bus area S1, a second bus area S2 and a third bus area S3. In the embodiment, the first bus area S1, the second bus area S2 and the third bus area S3 are arranged side by side. Projections of the first bus area S1, the second bus area S2 and the third bus area S3 with respect to the chip (i.e., vertically projecting with respect to the chip) intersect with the first electrode N1 (which may further include the electrode N1', the electrode N1" and the like), the second electrode N2 (which may further include the electrode N2', the electrode N2" and the like) and the third electrode N3 (which may further include the electrode N3', the electrode N3" and the like), and at least partly overlap with the first electrode N1 (which may further include the electrode N1', the electrode N1" and the like), the second electrode N2 (which may further include the electrode N2', the electrode N2" and the like) and the third electrode N3 (which may further include the electrode N3', the electrode N3" and the like). That is, Projections of the first bus area S1, the second bus area S2 and the third bus area S3 at least partly or totally overlap with the semiconductor chip. In FIG. 15, the first bus area S1, the second bus area S2 and the third bus area S3 are parallel to each other. The first bus area S1, the second bus area S2 and the third bus area S3 are perpendicular to the first electrode N1, the second electrode N2 and the third electrode N3. In other exemplary embodiments of the present disclosure, the first bus area S1, the second bus area S2 and the third bus area S3 may be not completely parallel to each other. The first bus area S1, the second bus area S2 and the third bus area S3 may be intersected at other angles with respect to the first electrode N1, the second electrode N2 and the third electrode N3. These variations also belong to the protection scope of the present disclosure.

In the present implementation, the first bus terminal T1, the second bus terminal T2 and the third bus terminal T3 may be distributed in the first bus area S1, the second bus area S2 and the third bus area S3. For example, the first bus terminal T1 is located in the first bus area S1, the second bus terminal T2 is located in the second bus area S2, and the third bus terminal T3 is located in the third bus area S3. Alternatively, the first bus terminal T1 is located in the third bus area S3, the second bus terminal T2 is located in the second bus area S2, and the third bus terminal T3 is located in the first bus area S1. Alternatively, a part of the first bus terminal T1 and a part of the second bus terminal T2 are located in the first bus area S1; another part of the first bus terminal T1 and another part of the second bus terminal T2 are located in the second bus area S2; and the third bus terminal T3 is located in the third bus area S3. That is, the first bus terminal T1, the second bus terminal T2 and the third bus terminal T3 may be distributed in the first bus area S1, the second bus area S2 and the third bus area S3 in various manners, which will not be described one by one in the present exemplary implementation. In addition, an insulating layer is required between the first bus terminal T1, the second bus terminal T2 and the third bus terminal T3 and the first electrode N1 (which may further include the electrode N1', the electrode N1" and the like), the second electrode N2 (which may further include the electrode N2', the electrode N2" and the like) and the third electrode N3 (which may further include the electrode N3', the electrode N3" and the like). The first bus terminal T1, the second bus terminal T2 and the third bus terminal T3 may be electrically connected to the first electrode N1 (which may further include an electrode N1', the electrode N1" and the like), the second electrode N2 (which may further include the electrode N2', the electrode N2" and the like) and the third electrode N3 (which may further include the electrode N3', the electrode N3" and the like) through holes. Therefore, any one of the bus terminals may electrically connect a plurality of electrodes which have substantially the same voltage potential in one bridge or a plurality of electrodes which have substantially the same voltage potential in a plurality of bridges. Specifically, any one of the bus terminals may also connect only one electrode of the bridges, which is just for facilitating connection to outside.

Figure 16:
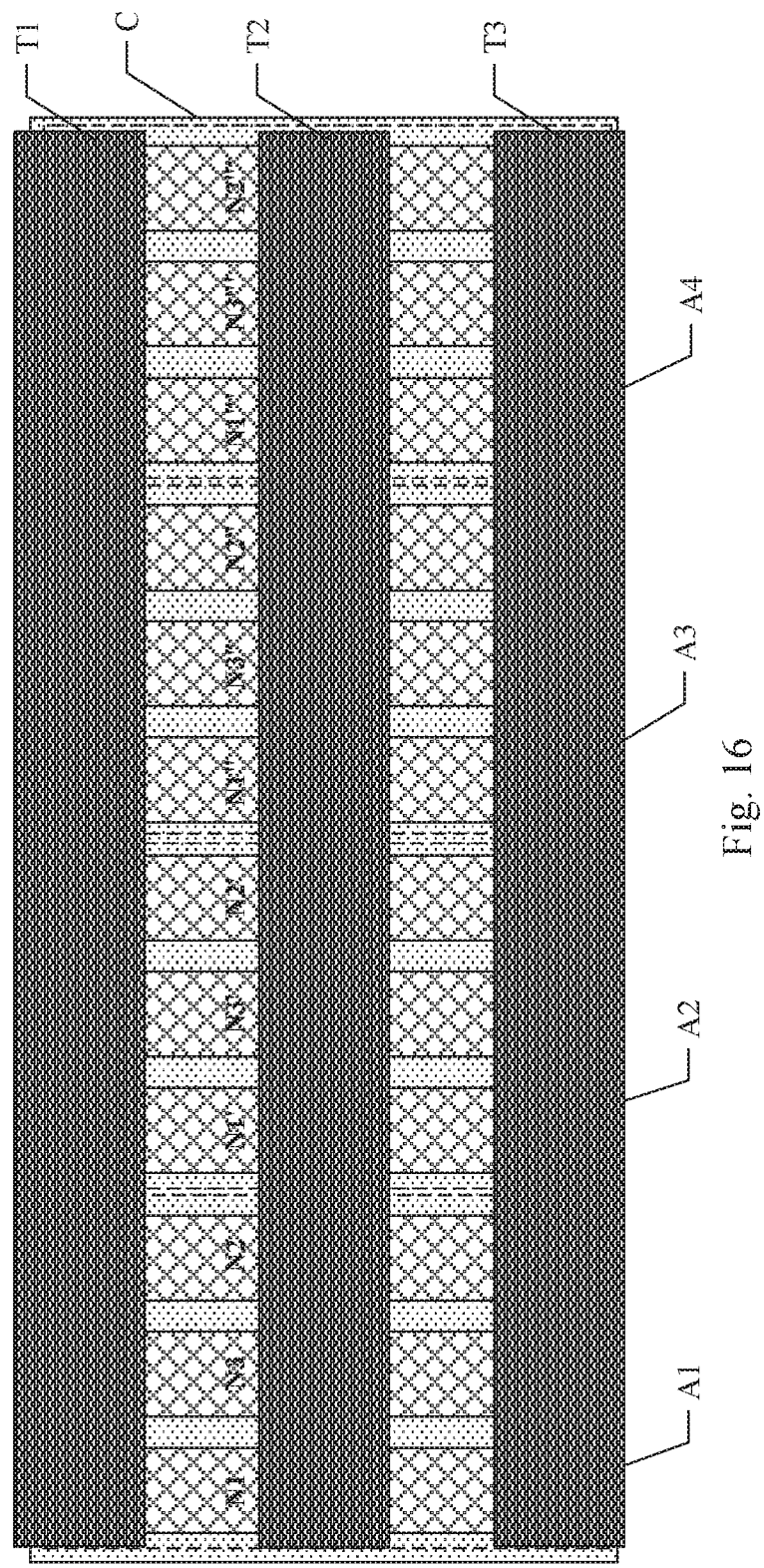
FIG. 16 is a plan schematic diagram of a power integrated module according to an exemplary implementation of the present disclosure.

For example, as shown in FIG. 16, the second bus area S2 is located between the first bus area S1 and the third bus area S3. The first bus terminal T1, the second bus terminal T2 and the third bus terminal T3 are all bar-type electrodes. The first bus terminal T1 is located in the first bus area S1. The second bus terminal T2 is located in the second bus area S2. The third bus terminal T3 is located in the third bus area S3. Thus, the first bus terminal T1, the second bus terminal T2 and the third bus terminal T3 are arranged in parallel and side by side. In this way, respective bus terminals are closer to each other, and even directly disposed above the chip. Therefore, equivalent impedance generated by the electrodes of the respective bridges in the power integrated module may be effectively reduced. For example, the equivalent impedance generated by the second electrode N2 may be reduced from the initial formula of (R+L) to a formula of (R+L)/3, i.e., the equivalent impedance may be reduced to at least one third of the initial value.

Figure 17:
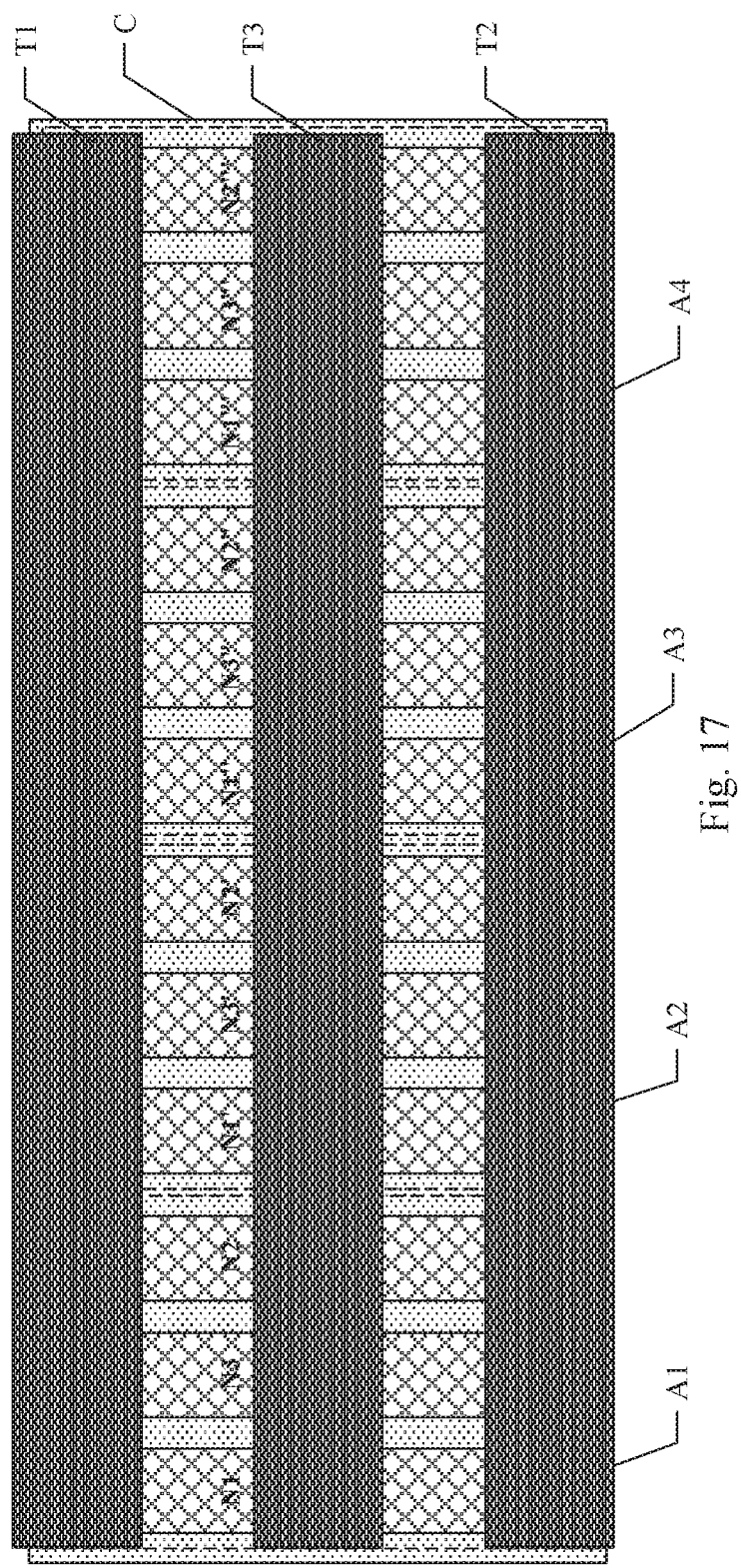
FIG. 17 is a plan schematic diagram of a power integrated module according to an exemplary implementation of the present disclosure.
Figure 18:
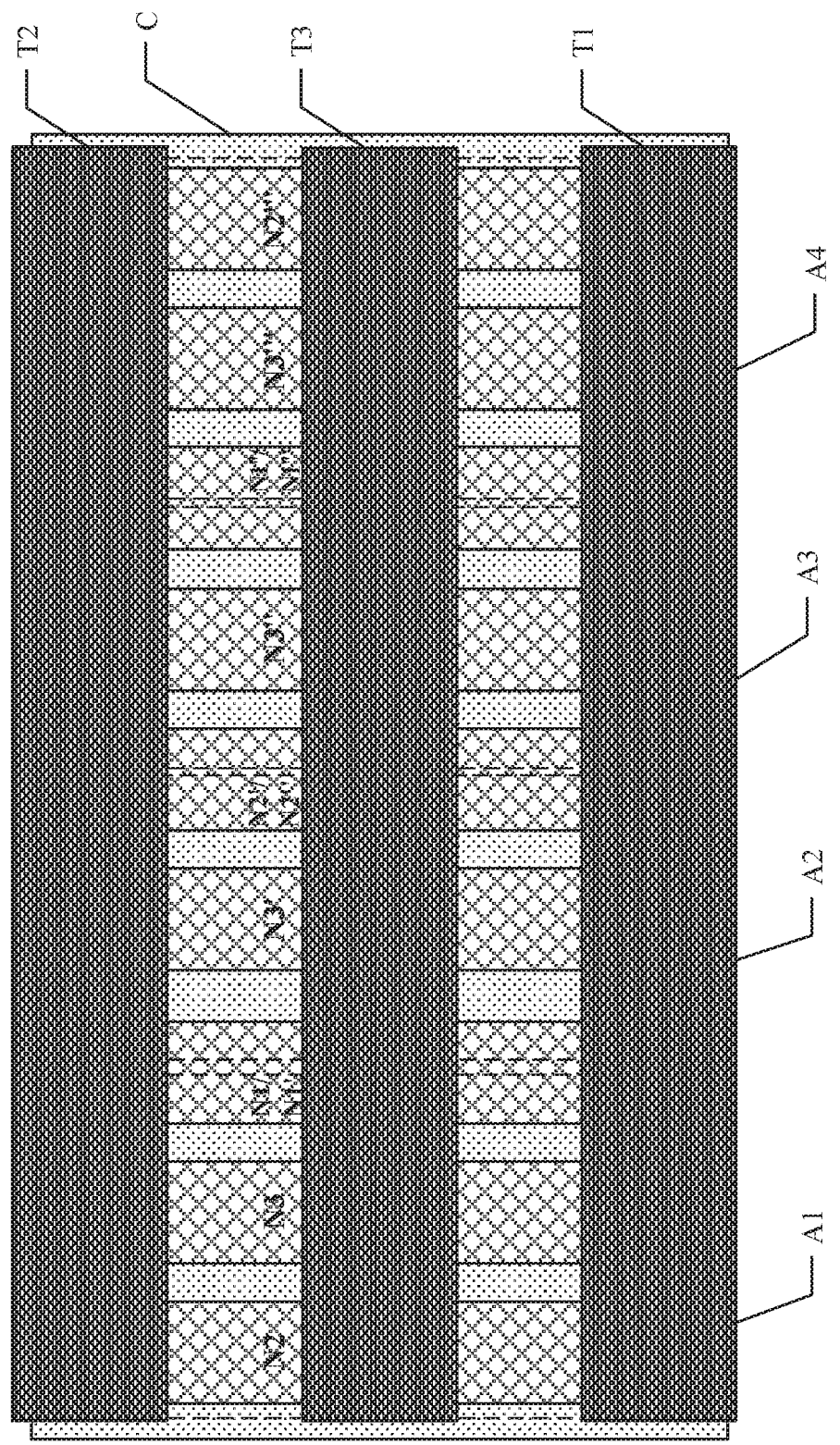
FIG. 18 is a plan schematic diagram of a power integrated module according to an exemplary implementation of the present disclosure.

For another example, as shown in FIG. 17, the third bus area S3 is located between the first bus area S1 and the second bus area S2. The first bus terminal T1, the second bus terminal T2 and the third bus terminal T3 are all bar-type electrodes. The first bus terminal T1 is located in the first bus area S1. The second bus terminal T2 is located in the second bus area S2. The third bus terminal T3 is located in the third bus area S3. Thus, the first bus terminal T1, the second bus terminal T2 and the third bus terminal T3 are arranged in parallel and side by side. In this way, the equivalent impedance generated by the third electrode N3 may be reduced from the initial formula of (R+L) to the formula of (R+L)/3, i.e., the equivalent impedance may be reduced to at least one third of the initial value. Among the first electrode N1 (also applicable to the electrode N1', the electrode N1" and the like), the second electrode N2 (also applicable to the electrode N2', the electrode N2" and the like) and the third electrode N3 (also applicable to the electrode N3', the electrode N3" and the like), current flowing through the third electrode N3 (also applicable to the electrode N3', the electrode N3" and the like) is the largest. Therefore, with the technical scheme as shown in FIG. 17, the impedance of the electrode with the largest current may be smaller than other electrodes, thus overall performance of the power integrated module is further optimized. In addition, the above technical scheme is also applicable to power integrated modules similar to those as shown in FIGS. 12A~12B, i.e., embodiments having merged electrodes, which may for example be referred to in FIG. 18.

Figure 19:
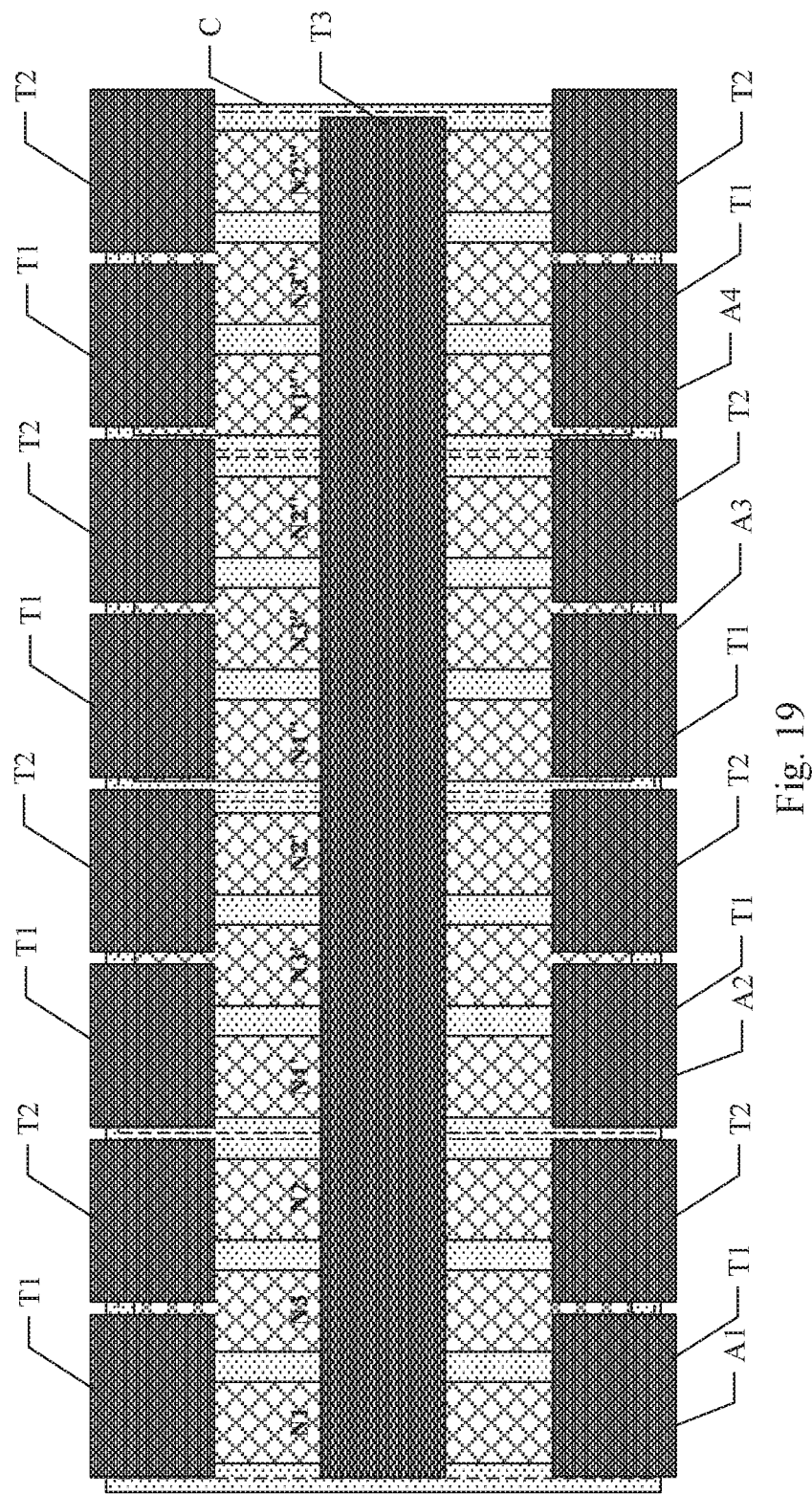
FIG. 19 is a plan schematic diagram of a power integrated module according to an exemplary implementation of the present disclosure.
Figure 20:
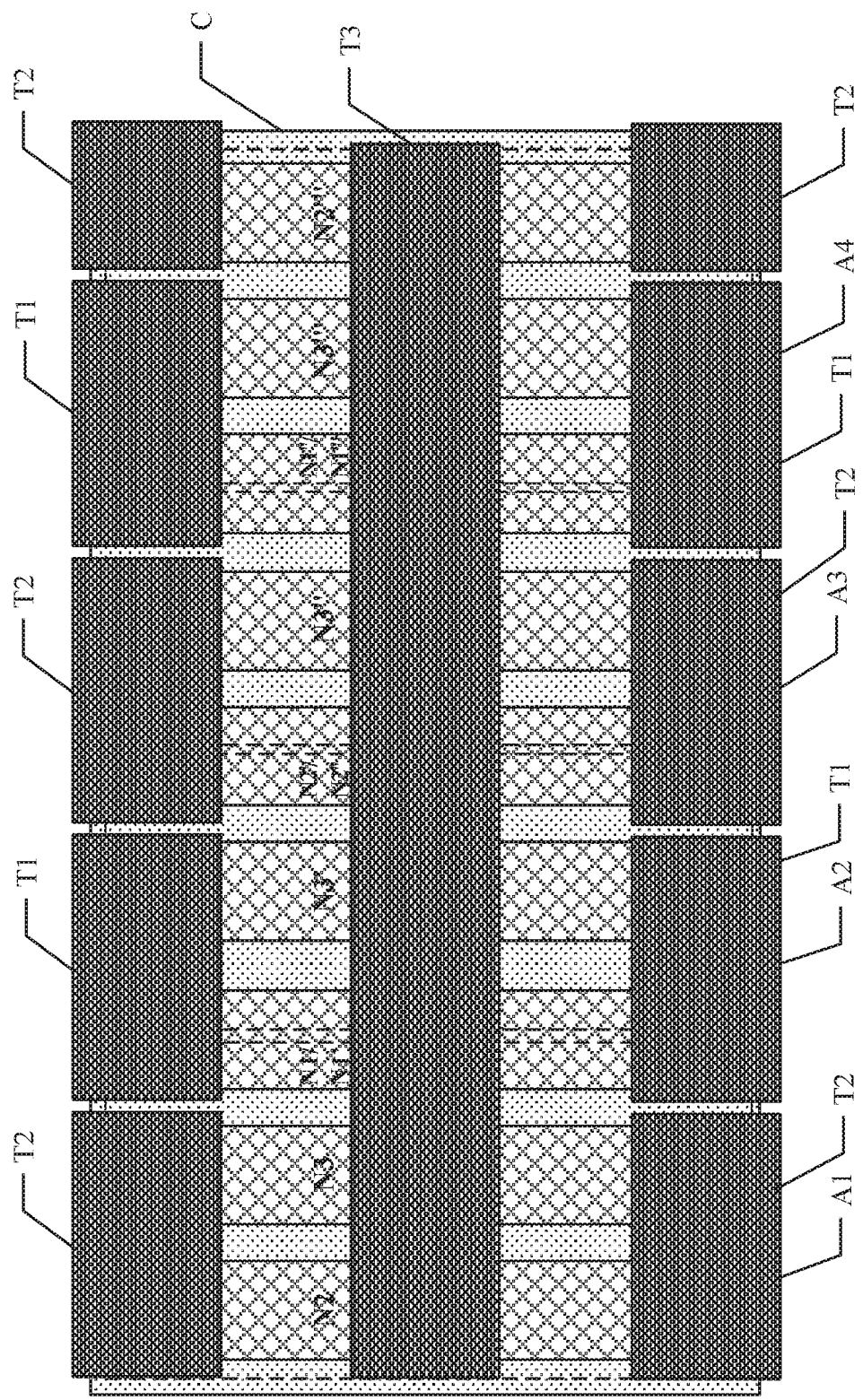
FIG. 20 is a plan schematic diagram of a power integrated module according to an exemplary implementation of the present disclosure.

In FIG. 17, the impedance generated by the first electrode N1 and the second electrode N2 still approach the formula of (R+L). For this reason, the present exemplary implementation is further improved. As shown in FIG. 19, the first bus terminal T1 includes a plurality of segments of first sub bus terminals, and the second bus terminal T2 includes a plurality of segments of second sub bus terminals. The plurality of segments of first sub bus terminals and the plurality of segments of second sub bus terminals are interleaved in the first bus area S1 and the second bus area S2. The third bus terminal T3 is a bar-type electrode and located in the third bus area S3. With improvement in FIG. 19, the equivalent impedance generated by each of the electrodes may be reduced to the formula of (R+L)/3, which is more applicable to high frequency applications. In addition, the above technical scheme is also applicable to power integrated modules similar to those as shown in FIGS. 12A~12B, i.e., embodiments having merged electrodes, which may for example be referred to in FIG. 20.

Figure 21A:
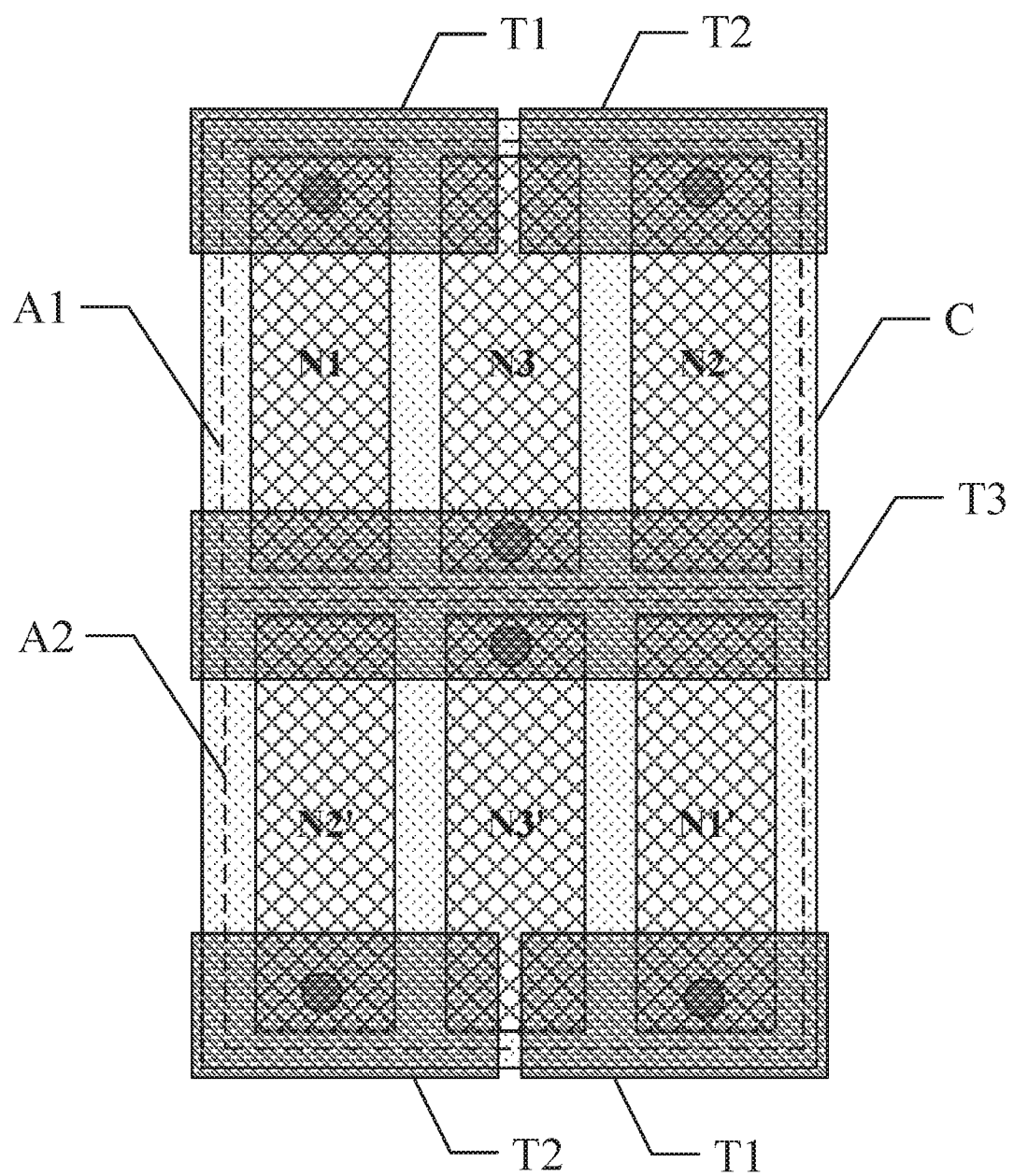
FIG. 21A is a plan schematic diagram of a power integrated module according to an exemplary implementation of the present disclosure.
Figure 21B:
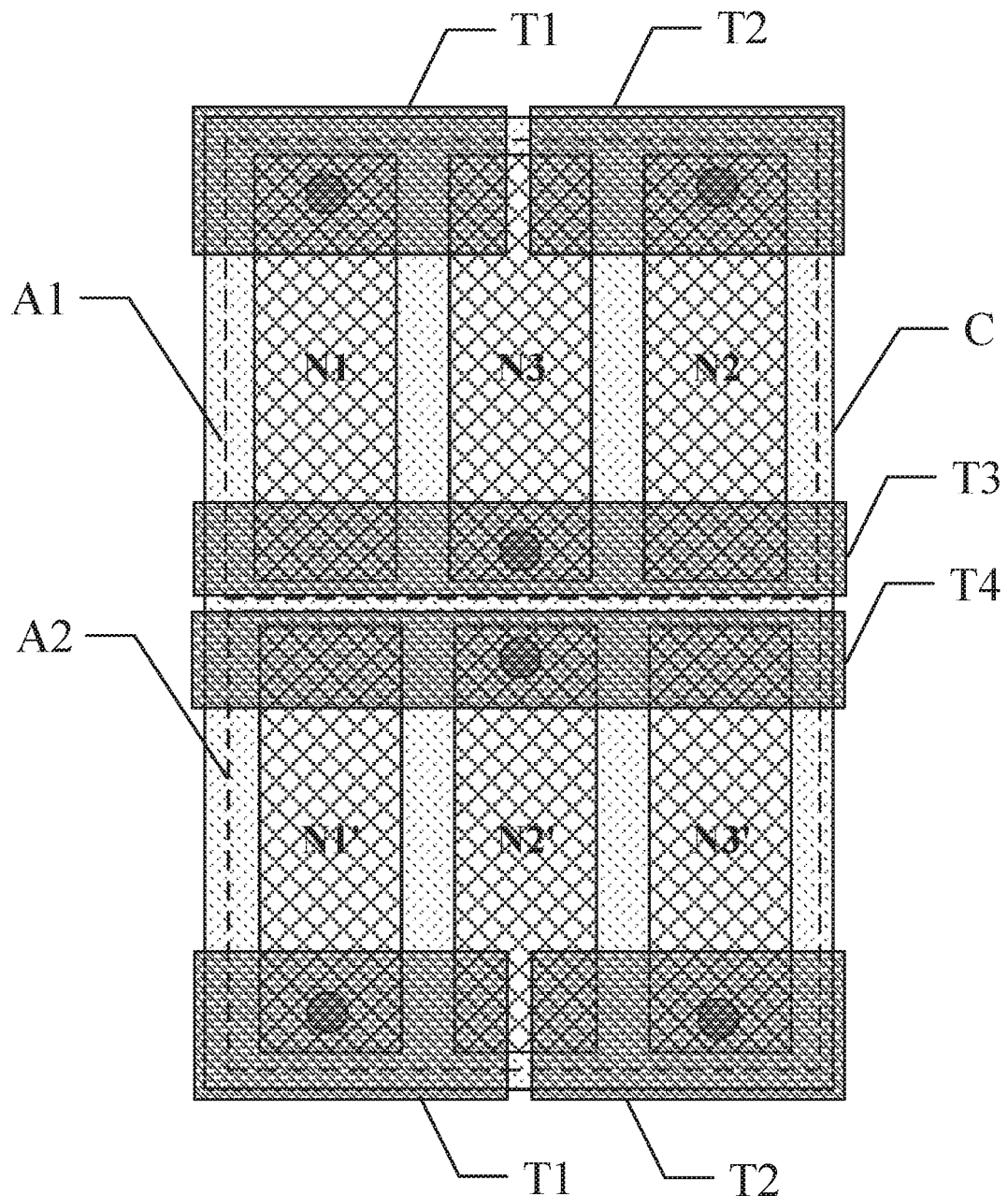
FIG. 21B is a plan schematic diagram of a power integrated module according to an exemplary implementation of the present disclosure.
Figure 21C:
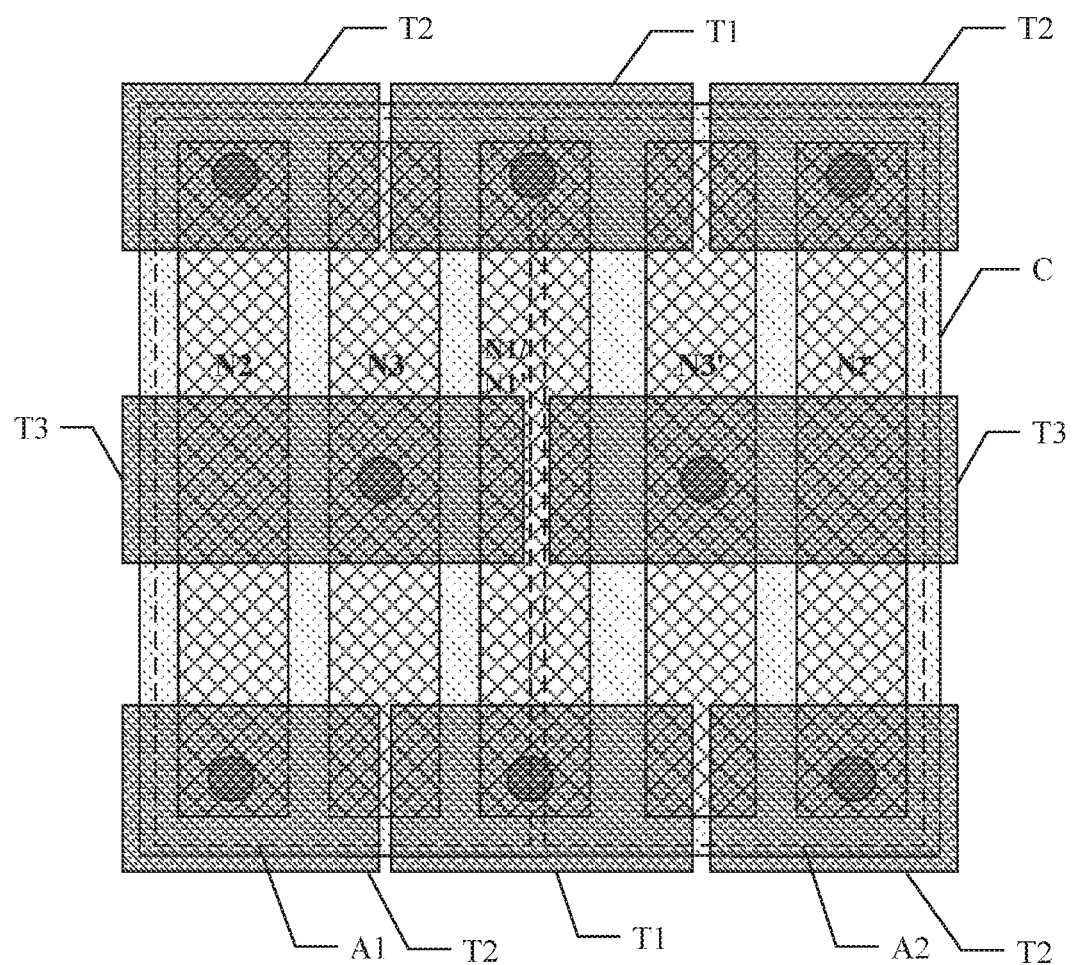
FIG. 21C is a plan schematic diagram of a power integrated module according to an exemplary implementation of the present disclosure.

In addition, as shown in FIGS. 21A~21C, FIG. 21A illustrates a power integrated module including a plurality of bridges, and a conflux manner that all bridges are connected together in parallel. All the bridges may be formed in the same semiconductor chip. FIGS. 21B and 21C illustrate a power integrated module including a plurality of bridges, and a conflux manner that each bridge is separate from each other. The conflux manner in FIG. 21A is similar to that of FIG. 19, which will not be repeated herein. In FIGS. 21B and 21C, the third electrodes N3 of every bridges are not interconnected, therefore the first bus terminal T1 includes a plurality of segments of the first sub bus terminals, the second bus terminal T2 includes a plurality of segments of the second sub bus terminals, and the plurality of segments of the first sub bus terminals and the plurality of segments of the second sub bus terminals are interleaved in the first bus area S1 and the second bus area S2. The third bus terminal T3 is a bar-type electrode and located in the third bus area S3. The power integrated module further contains a fourth bus terminal T4. The fourth bus terminal T4 is electrically connected to the sixth electrode N3' and located in the third bus area S3. The fourth bus terminal T4 and the third bus terminal T3 are arranged side by side. Therefore, the conflux scheme in the present implementation may also be extended to apply in power integrated module containing more bridges, which is not limited to the enumerated manners in the present exemplary implementation.

Figure 22:
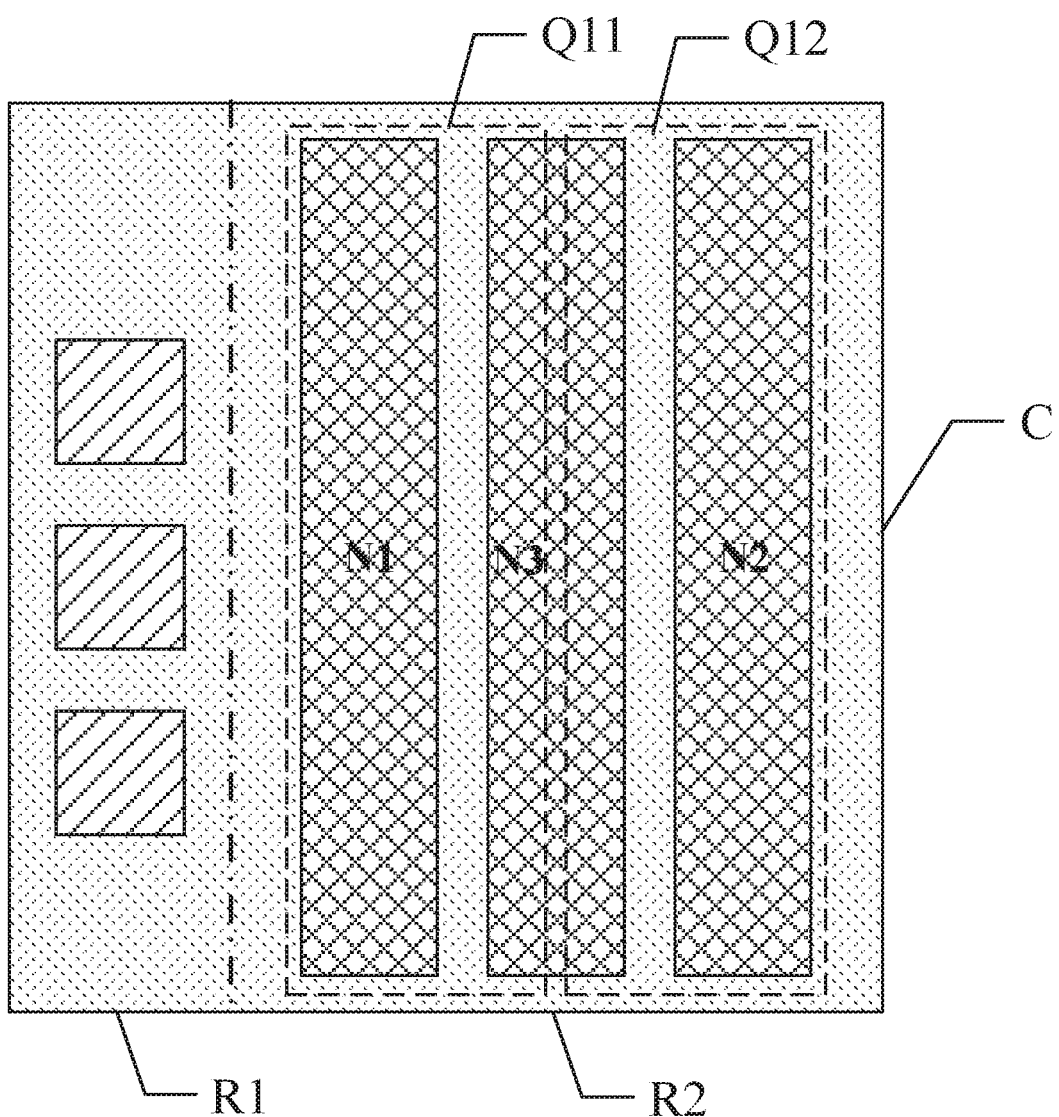
FIG. 22 is a plan schematic diagram of a power integrated module according to an exemplary implementation of the present disclosure.

Further, in order to achieve controlling the bridge switches in the above power integrated module, in the present exemplary implementation, the power integrated module may further include a driving circuit. The driving circuit may generate a driving signal based on a control signal, and correspondingly output the driving signal to the control terminal of the upper bridge switch and the control terminal of the lower bridge switch, so as to control the respective bridge switches (or the contained sub switches) to be turned on or off according to the driving signal. As shown in FIG. 22, the semiconductor chip in the present exemplary implementation may include a first region R1 (also called a logic region) and a second region R2 (also called a power region) which are adjacent to each other. The first region R1 may be used for providing the control signal. The second region R2 may be used for forming the respective bridge switches in the above power integrated module, such as the first upper bridge switch Q11 and the first lower bridge switch Q12. After the first region R1 generates or receives the control signal, the control signal may be transmitted to the driving circuit. The driving circuit generates the driving signal based on the control signal, and transmits the driving signal to the respective bridge switches through the conductor of the interconnection layer inside the semiconductor chip, so as to control the respective bridge switches to be turned on or off.

Figure 23:
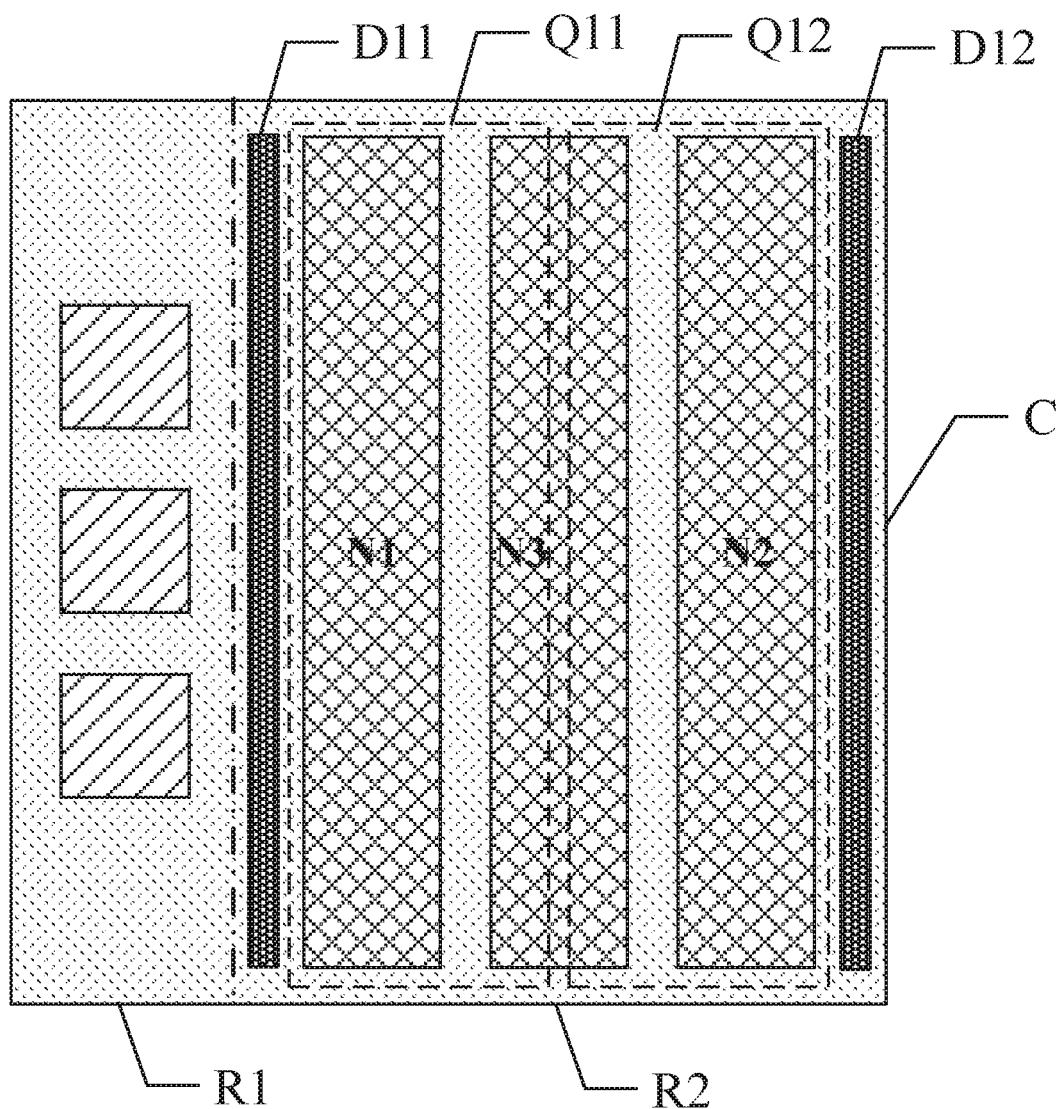
FIG. 23 is a plan schematic diagram of a power integrated module according to an exemplary implementation of the present disclosure.

In traditional technology, the driving circuit is usually located in the first region R1, and shapes of the driving circuits are various. The loop inductance of the second region R2 may be significantly reduced through optimization in the above exemplary embodiment. However, frequency characteristic of the power integrated module may still be limited by the driving circuit of the respective bridge switches. For this reason, as shown in FIG. 23, in the present exemplary implementation, not only the first upper bridge switch Q11 and the first lower bridge switch Q12 in the second region R2, but also the driving circuit (for example, the driving circuit of the first upper bridge switch Q11 is located in the shown region D11, and the driving circuit of the first lower bridge switch Q12 is located in the shown region D12) is located in the second region R2. In this way, by a manner of disposing the driving circuit close to the switch transistor that needs to be controlled, a distance between the driving circuit and the electrodes that need to be connected, may be greatly reduced, such that driving resistance and driving inductance may be reduced, and driving speeds may be greatly increased, thus switch speeds of the bridge switches may be increased, and switch losses may be decreased, which may facilitate to increase operating frequencies. In addition, interconnection between the driving circuit and the electrodes of the bridges, as shown in FIG. 23, is mainly formed inside the semiconductor chip, and it is not required to lead to the surface of the semiconductor chip, therefore the surface of the semiconductor chip may not be occupied by connection lead between driver circuit and the electrodes of the bridges.

Figure 24:
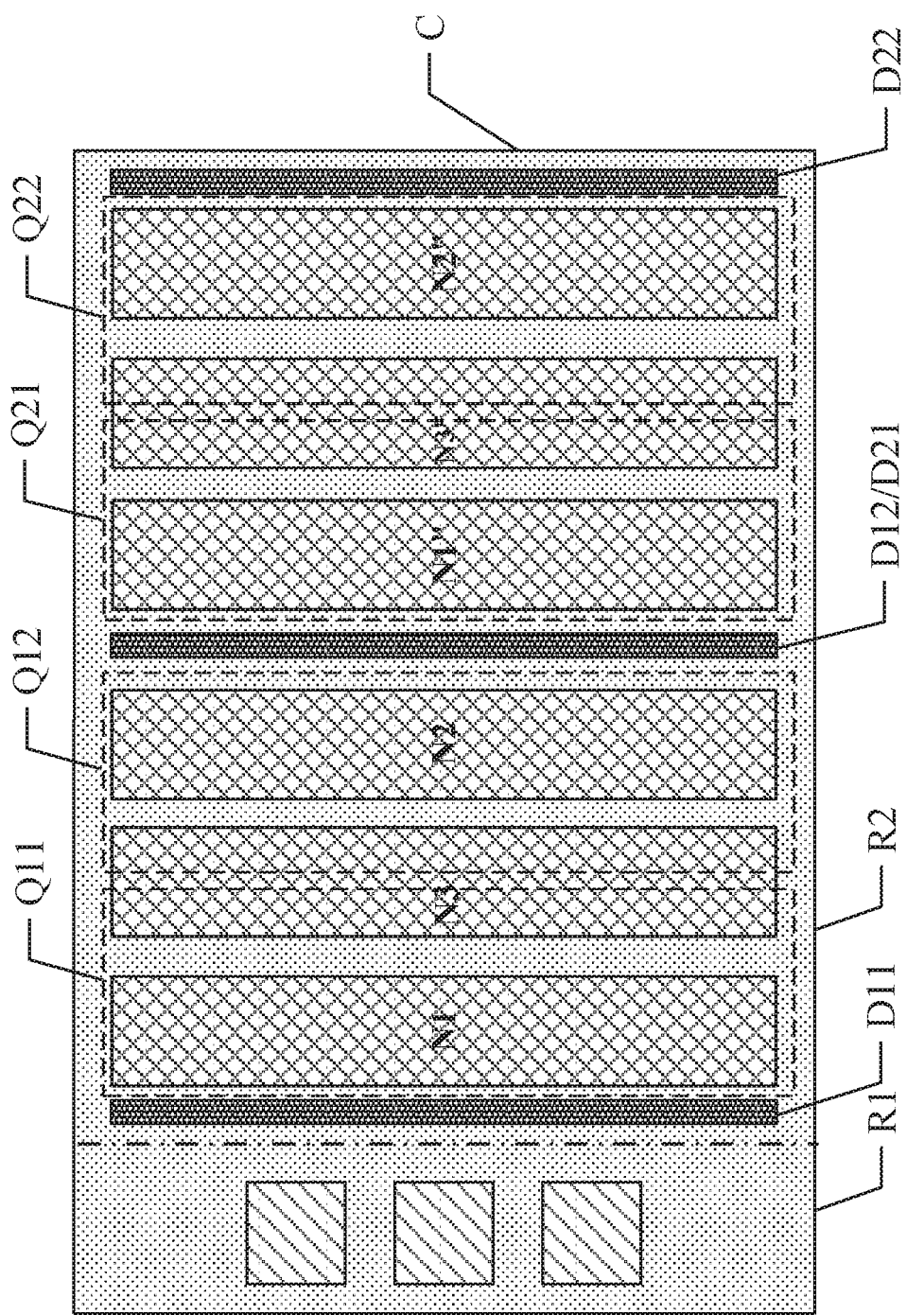
FIG. 24 is a plan schematic diagram of a power integrated module according to an exemplary implementation of the present disclosure.
Figure 25:
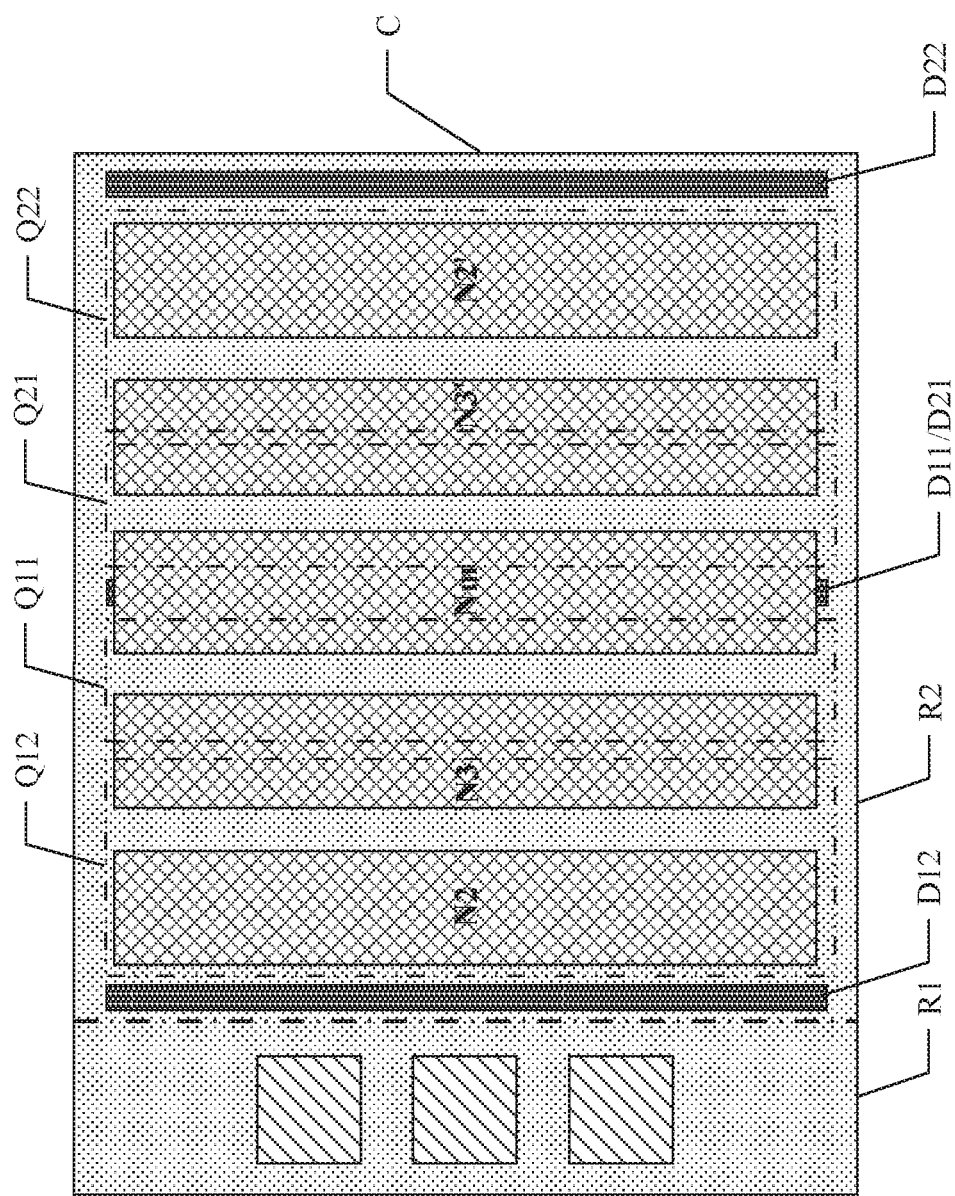
FIG. 25 is a plan schematic diagram of a power integrated module according to an exemplary implementation of the present disclosure.

As shown in FIG. 23, in the present implementation, the driving circuit region D11 and the driving circuit region D12 may be in a bar-type shape the same as that of the first electrode N1, the second electrode N2 and the third electrode N3, and are arranged close to and side by side with the first upper bridge switch Q1 and the first lower bridge switch Q12. Therefore, the respective sub switches in the respective bridge switches may be driven uniformly, so as to cooperate synchronously, to further improve frequencies that can be applied. FIGS. 24 and 25 are schematic diagrams of arrangement of a driving circuit when the power integrated module includes a plurality of more bridges. All the bridges may be formed in the same semiconductor chip. In the embodiment, the driving circuit for driving the first upper bridge switch Q11 (or the respective sub switches of the first upper bridge switch) is located in the region D11. The driving circuit for driving the first lower bridge switch Q12 (or the respective sub switches of the first lower bridge switch) is located in the region D12. The driving circuit for driving the second upper bridge switch Q21 (or the respective sub switches of the second upper bridge switch) is located in the region D21. The driving circuit for driving the second lower bridge switch Q22 (or the respective sub switches of the second lower bridge switch) is located in the region D22. All the driving circuits are located in the second region R2. The respective driving circuits are in a bar-type shape and arranged close to the respective bridge switches. The principle in FIGS. 24 and 25 is similar to that in FIG. 23, which will not be repeated herein. The regions where the driving circuits are located in and shapes of the respective electrodes are not limited to bar-type shapes (for example as shown in the above related description in FIG. 3). The present disclosure is not limited thereto.

The power integrated module in the present implementation may be applied in a Boost conversion circuit, a Buck conversion circuit, a full bridge circuit, a half bridge circuit or the like. Additionally, the bridges in the present exemplary implementation may further be multiple-level bridges, such as three-level bridges, five-level bridges and the like. Therefore, the present exemplary implementation does not specially define specific applications of the above power integrated module. Additionally, in the present exemplary implementation, the above third electrode and the sixth electrode may electrically belong to the same electrode, i.e., the two bridges are in parallel; and in another implementation, the above third electrode and the sixth electrode may electrically belong to different electrodes, i.e., the two bridges are separate from each other, which is not specially defined in the present exemplary embodiment either.

Accordingly, based on one conception, various aspects of the power integrated module of the semiconductor chip in the present exemplary implementation are optimized. Therefore, the performance of the power integrated module may be greatly improved, such that distribution parameters of the power integrated module are smaller, and the interior interconnection impedance is smaller, thus the power integrated module may be more applicable for high frequency applications.

The present disclosure has been described by the above related embodiments. However, the above embodiments are only examples for implementing the present disclosure. It should be noted that, the scope of the present disclosure is not limited to the disclosed embodiments. Any modification and amendment without departing from the scope and sprit of the present disclosure will fall within the patent protection scope of the present disclosure.

What is claimed is:

1. A power integrated module, comprising at least one first bridge formed in a chip, wherein the first bridge comprises:
    a first upper bridge switch, comprising a first end, a second end and a control end;
    a first lower bridge switch, comprising a first end, a second end and a control end;
    a first electrode, electrically connected to the first end of the first upper bridge switch:
    a second electrode, electrically connected to the second end of the first lower bridge switch; and
    a third electrode, electrically connected to the second end of the first upper bridge switch and the first end of the first lower bridge switch,
    wherein the first electrode, the second electrode and the third electrode are bar-type electrodes located above the first upper bridge switch and the first lower bridge switch, and
    the power integrated module further comprises at least one second bridge formed in the chip, and the second bridge comprises:
    a second upper bridge switch, comprising a first end, a second end and a control end;
    a second lower bridge switch, comprising a first end, a second end and a control end;
    a fourth electrode, electrically connected to the first end of the second upper bridge switch;
    a fifth electrode, electrically connected to the second end of the second lower bridge switch; and
    a sixth electrode, electrically connected to the second end of the second upper bridge switch and the first end of the second lower bridge switch,
    wherein the third electrode is located between the first electrode and the second electrode, the sixth electrode is located between the fourth electrode and the fifth electrode, and
    the fourth electrode is adjacent to the first electrode, or the fourth electrode is adjacent to the second electrode, or the fifth electrode is adjacent to the first electrode, or the fifth electrode is adjacent to the second electrode.

2. The power integrated module according to claim 1, further comprising at least one third bridge formed in the chip, wherein the third bridge comprises:
   a third upper bridge switch, comprising a first end, a second end and a control end:
   a third lower bridge switch, comprising a first end, a second end and a control end;
   a seven electrode, electrically connected to the first end of the third upper bridge switch:
   an eighth electrode, electrically connected to the second end of the third lower bridge switch; and
   a ninth electrode, electrically connected to the second end of the third upper bridge switch and the first end of the third lower bridge switch,
   wherein the seventh electrode, the eighth electrode and the ninth electrode are located on extension lines of the second electrode, the first electrode and the third electrode respectively; or the seventh electrode, the eighth electrode and the ninth electrode are located on extension lines of the first electrode, the second electrode and the third electrode respectively.

3. The power integrated module according to claim 1, wherein the first end of the second upper bridge switch is electrically connected to the first end of the first upper bridge switch, the second end of the second upper bridge switch is electrically connected to the second end of the first upper bridge switch, and the second end of the second lower bridge switch electrically is connected to the second end of the first lower bridge switch.

4. The power integrated module according to claim 1, wherein the first electrode and the fourth electrode are merged into one merged electrode, and the first to sixth electrodes are arranged side by side in an order of arrangement of the second electrode, the third electrode, the merged electrode, the sixth electrode and the fifth electrode, or
   the second electrode and the fifth electrode are merged into one merged electrode, and the first to sixth electrodes are arranged side by side in an order of arrangement of the first electrode, the third electrode, the merged electrode, the sixth electrode and the fourth electrode.

5. The power integrated module according to claim 1, further comprising:
   at least one driving circuit, configured to generate at least a driving signal to control the first upper bridge switch, the first lower bridge switch, the second upper bridge switch and the second lower bridge switch,
   wherein the driving circuit is formed in a bar-type region in the chip, and the bar-type region is arranged close to the first bridge or the second bridge.

6. The power integrated module according to claim 1, further comprising:
   at least two bus capacitors, electrically connected to the first electrode and the second electrode.

7. The power integrated module according to claim 6, wherein the power integrated module is provided on a carrier plate, the bus capacitors are provided at two ends of the first electrode and the second electrode respectively, and a projection of the chip with respect to the carrier plate does not overlap a projection of the bus capacitor with respect to the carrier plate.

8. The power integrated module according to claim 6, wherein the bus capacitors are provided above the chip.

9. A power integrated module, comprising at least one first bridge formed in a chip, wherein the first bridge comprises:
   a first upper bridge switch, comprising a first end, a second end and a control end;
   a first lower bridge switch, comprising a first end, a second end and a control end;
   a first electrode, electrically connected to the first end of the first upper bridge switch:
   a second electrode, electrically connected to the second end of the first lower bridge switch; and
   a third electrode, electrically connected to the second end of the first upper bridge switch and the first end of the first lower bridge switch,
   wherein the first electrode, the second electrode and the third electrode are bar-type electrodes arranged side by side, and located above the first upper bridge switch and the first lower bridge switch, and
   the power integrated module further comprises at least one second bridge formed in the chip, and the second bridge comprises;
   a second upper bridge switch, comprising a first end, a second end and a control end;
   a second lower bridge switch, comprising a first end, a second end and a control end;
   a fourth electrode, electrically connected to the first end of the second upper bridge switch;
   a fifth electrode, electrically connected to the second end of the second lower bridge switch; and
   a sixth electrode, electrically connected to the second end of the second upper bridge switch and the first end of the second lower bridge switch,
   wherein the fourth electrode, the fifth electrode and the sixth electrode are located on extension lines of the second electrode, the first electrode and the third electrode respectively; or the fourth electrode, the fifth electrode and the sixth electrode are located on extension lines of the first electrode, the second electrode and the third electrode respectively.

10. The power integrated module according to claim 9, wherein the third electrode is located between the first electrode and the second electrode, the sixth electrode is located between the fourth electrode and the fifth electrode.

11. The power integrated module according to claim 9, wherein the first end of the second upper bridge switch is electrically connected to the first end of the first upper bridge switch, the second end of the second upper bridge switch is electrically connected to the second end of the first upper bridge switch, and the second end of the second lower bridge switch electrically is connected to the second end of the first lower bridge switch.

12. The power integrated module according to claim 9, further comprising:
   at least one driving circuit, configured to generate at least a driving signal to control the first upper bridge switch, the first lower bridge switch, the second upper bridge switch and the second lower bridge switch,
   wherein the driving circuit is formed in a bar-type region in the chip, and the bar-type region is arranged close to the first bridge switch or the second bridge.

13. The power integrated module according to claim 9, further comprising:
   at least two bus capacitors, electrically connected to the first electrode and the second electrode.

14. The power integrated module according to claim 13, wherein the power integrated module is provided on a carrier plate, the bus capacitors are provided at two ends of the first electrode and the second electrode respectively, and a projection of the chip with respect to the carrier plate does not overlap a projection of the bus capacitor with respect to the carrier plate.

15. The power integrated module according to claim 13, wherein the bus capacitors are provided above the chip.

\* \* \* \* \*